(12) United States Patent
Iida et al.

(10) Patent No.: US 11,257,981 B2
(45) Date of Patent: Feb. 22, 2022

(54) QUANTUM DOT AND WAVELENGTH CONVERTING MEMBER, LIGHTING MEMBER, BACK LIGHT UNIT, AND DISPLAY DEVICE USING QUANTUM DOT, AND METHOD OF PRODUCING QUANTUM DOT

(71) Applicant: NS MATERIALS INC., Fukuoka (JP)

(72) Inventors: Kazunori Iida, Fukuoka (JP); Emi Tsutsumi, Fukuoka (JP); Yuko Ogura, Fukuoka (JP); Masanori Tanaka, Fukuoka (JP); Soichiro Nikata, Fukuoka (JP); Yuka Takamizuma, Fukuoka (JP)

(73) Assignee: NS MATERIALS INC., Fukuoka (JP)

( * ) Notice: Subject to any disclaimer, the term of this patent is extended or adjusted under 35 U.S.C. 154(b) by 0 days.

(21) Appl. No.: 16/633,010

(22) PCT Filed: Jul. 27, 2018

(86) PCT No.: PCT/JP2018/028192
§ 371 (c)(1),
(2) Date: Jan. 22, 2020

(87) PCT Pub. No.: WO2019/022217
PCT Pub. Date: Jan. 31, 2019

(65) Prior Publication Data
US 2020/0212256 A1    Jul. 2, 2020

(30) Foreign Application Priority Data

Jul. 27, 2017 (JP) .............................. JP2017-145269
Oct. 12, 2017 (JP) .............................. JP2017-198667

(51) Int. Cl.
*H01L 33/00* (2010.01)
*B82Y 40/00* (2011.01)
(Continued)

(52) U.S. Cl.
CPC .............. *H01L 33/06* (2013.01); *B82Y 15/00* (2013.01); *B82Y 40/00* (2013.01); *G02F 1/133603* (2013.01); *H01L 33/504* (2013.01)

(58) Field of Classification Search
CPC ....... H01L 33/06; H01L 33/504; B82Y 15/00; B82Y 40/00
See application file for complete search history.

(56) References Cited

U.S. PATENT DOCUMENTS

| 2002/0179922 | A1 | 12/2002 | Andriessen |
| 2005/0001539 | A1 | 1/2005 | Andriessen |

(Continued)

FOREIGN PATENT DOCUMENTS

| CN | 106544003 | 3/2017 |
| CN | 106753381 | 5/2017 |

(Continued)

OTHER PUBLICATIONS

Extended Search Report from European Patent Office (EPO) in European Patent Appl. No. 18838399.6, dated Nov. 20, 2020.
(Continued)

*Primary Examiner* — Sue A Purvis
*Assistant Examiner* — Scott Stowe
(74) *Attorney, Agent, or Firm* — Greenblum & Bernstein, P.L.C.

(57) ABSTRACT

The present invention seeks to provide cadmium-free quantum dots with a narrow fluorescence FWHM. The quantum dot does not contain cadmium and its fluorescence FWHM is 30 nm or less. The quantum dot is preferably a nanocrystal containing zinc and tellurium or zinc and tellurium and sulfur or zinc and tellurium and selenium and sulfur. Further, the quantum dot preferably has a core-shell structure in which the nanocrystal serves as a core and the surface of the core is coated with a shell.

11 Claims, 17 Drawing Sheets

(51) Int. Cl.
*H01L 33/06* (2010.01)
*B82Y 15/00* (2011.01)
*G02F 1/13357* (2006.01)
*H01L 33/50* (2010.01)

(56) References Cited

U.S. PATENT DOCUMENTS

| | | |
|---|---|---|
| 2005/0129947 A1 | 6/2005 | Peng et al. |
| 2009/0021148 A1 | 1/2009 | Hachiya et al. |
| 2009/0108235 A1 | 4/2009 | Ando et al. |
| 2009/0159849 A1 | 6/2009 | Uehara et al. |
| 2011/0175054 A1 | 7/2011 | Ren et al. |
| 2014/0001405 A1 | 1/2014 | Guo et al. |
| 2017/0153382 A1 | 6/2017 | Wang et al. |

FOREIGN PATENT DOCUMENTS

| | | |
|---|---|---|
| JP | 2002-338961 | 11/2002 |
| JP | 2006-291175 | 10/2006 |
| JP | 2016-177220 | 10/2016 |
| TW | 201412935 | 4/2014 |
| WO | 2004/066361 | 8/2004 |
| WO | 2006/120895 | 11/2006 |
| WO | 2007/034877 | 3/2007 |
| WO | 2007/060889 | 5/2007 |
| WO | 2009/034777 | 3/2009 |
| WO | 2016/151933 | 9/2016 |
| WO | 2017/067451 | 4/2017 |
| WO | 2017/086362 | 5/2017 |

OTHER PUBLICATIONS

Li et al., "Blue-UV-Emitting ZnSe(Dot)/ZnS(Rod) Core/Shell Nanocrystals Prepared from CdSe/CdS Nanocrystals by Sequential Cation Exchange," ACS NANO, vol. 6, No. 2, pp. 1637-1647 (2012).

Christophe Lincheneau et al., "Synthesis and properties of ZnTe and ZnTe/ZnS core/shell semiconductor nanocrystals;" Journal of Materials Chemistry C, 2, 2014, pp. 2877.

Jun Zhang et al., "Shape-Control of ZnTe Nanocrystal Growth in Organic Solutions;" Journal of Physical Chemistry C, 112 (14), 2008, pp. 5454-5458.

International Search Report issued in International Patent Application No. PCT/JP2018/028192, dated Oct. 30, 2018.

International Preliminary Report on Patentability issued in International Patent Application No. PCT/JP2018/028192, dated Jan. 28, 2020.

Written Opinion of the International Searching Authority issued in International Patent Application No. PCT/JP2018/028192, dated Oct. 30, 2018.

Extended Search Report issued in European Patent Appl. No. 18838399.6, dated Feb. 26, 2021.

QUANTUM DOT AND WAVELENGTH CONVERTING MEMBER, LIGHTING MEMBER, BACK LIGHT UNIT, AND DISPLAY DEVICE USING QUANTUM DOT, AND METHOD OF PRODUCING QUANTUM DOT

TECHNICAL FIELD

The present invention relates to quantum dots free of cadmium; a wavelength converting member, a lighting member, a back light unit, and a display device using quantum dots; and a method of producing quantum dots.

BACKGROUND ART

Quantum dots are nanoparticles made of around several hundreds to several thousands of atoms, each having a particle diameter of around several nanometers to several tens of nanometers. Quantum dots are also referred to as fluorescent nanoparticles, semiconductor nanoparticles, or nanocrystals.

The emission wavelength of quantum dots may be variously changed depending on the particle diameter and the composition of the nanoparticles. Examples of the properties of quantum dots include the fluorescence quantum yield (QY) and the full width at half maximum (FWHM) of the fluorescence peak (hereinafter referred to as fluorescence FWHM). When quantum dots are used as a wavelength conversion material for a visible light region, the reproducibility of a wider range of colors, that is, a wider color gamut can be given as the most major feature. Accordingly, in increasing the color gamut using a wavelength converting member for a visible light region with the use of quantum dots, the fluorescence FWHM is an important optical property.

Conventionally used high efficiency quantum dots mainly contain cadmium (Cd). Quantum dots containing Cd are advantageous in that a high fluorescence quantum yield and a narrow fluorescence FWHM can be achieved. On the other hand, because of the toxicity of Cd, the use of such quantum dots is restricted in many countries, which have been a large barrier in terms of the commercialization.

Meanwhile, the development of Cd-free quantum dots which do not contain Cd is intensively studied. Typical Cd-free quantum dots include chalcopyrite-based copper indium sulfide ($CuInS_2$): CIS-based quantum dots (for example, see WO 2007/060889 A: PTL 1). However, since the emission using such quantum dots is the defect emission, the optical performance is not high as compared with the case of using Cd-based quantum dots, and their fluorescence FWHM is typically 80 nm to 100 nm or more. This also applies to quantum dots using chalcopyrite other than CIS, and the composition of chalcopyrite-based quantum dots with a fluorescence FWHM of less than 60 nm has not been reported.

Further, typical Cd-free quantum dots also include indium phosphide (InP): InP-based quantum dots (for example, see PTL 1). However, the fluorescence FWHM is wide when InP-based quantum dots are used compared with the case of using CdSe-based quantum dots, and any composition of InP-based quantum dots with a fluorescence FWHM of less than 35 nm has not yet been reported.

In addition, although zinc selenide (ZnSe) is known as a material of Cd-free quantum dots, since the band gap of ZnSe is 2.7 eV, the emission of light with a longer wavelength than green light cannot be achieved when only ZnSe is used.

Another possible example of zinc-based quantum dots is zinc telluride (ZnTe); however, there are not many reports on a liquid phase synthesis using the quantum dots.

Journal of Materials Chemistry. C, 2014, 2, 2877 Synthesis and properties of ZnTe and ZnTe/ZnS core/shell semiconductor nanocrystals (NPL 1) below describes a method of the direct synthesis of ZnTe using an organic zinc compound and trialkylphosphine telluride in detail. For ZnTe obtained in NPL 1, for example the shifting of the absorption peak toward the longer wavelength side with the growth of particles is specifically studied; however, any ZnTe quantum dots synthesized in NPL 1 do not have fluorescent properties.

Further, in Journal of Physical Chemistry C, 2008, 112 (14), pp 5454-5458 Shape-Control of ZnTe Nanocrystal Growth in Organic Solution (NPL 2) below, ZnTe having a sphalerite structure is synthesized using an organic zinc compound and Te reduced by Super-Hydride® (lithium triethylborohydride: $LiBHEt_3$) as raw materials. Studies of controlling the form of nanoparticles of ZnTe by selecting from a variety of reaction conditions are reported. The method of synthesis is characterized by using Super-Hydride® which is very reactive and cannot readily be used in mass production. The particle form, the crystal structure, and the absorption spectrum for ZnTe obtained are reported in detail in the paper; however, the paper does not refer to the fluorescence properties.

CITATION LIST

Patent Literature

PTL 1: WO 2007/060889 A

Non-Patent Literature

NPL 1: Journal of Materials Chemistry. C, 2014, 2, 2877 Synthesis and properties of ZnTe and ZnTe/ZnS core/shell semiconductor nanocrystals NPL 2: Journal of Physical Chemistry C, 2008, 112(14), pp 5454-5458 Shape-Control of ZnTe Nanocrystal Growth in Organic Solution

SUMMARY OF INVENTION

Technical Problem

As described above, although quantum dots free of Cd such as CIS-based or InP-based quantum dots are being researched and developed, these quantum dots all have a large fluorescence FWHM.

Further, in methods for synthesizing ZnTe described above by direct synthesis, for example, diethylzinc ($Et_2Zn$) is typically used to increase the reactivity of a raw material for zinc. However, since diethylzinc is highly reactive and is flammable in air, it is difficult to handle and store the raw material; for example, diethylzinc must be handled in an inert gas flow. Accordingly, reactions using diethylzinc also involve risks such as heat generation or combustion, so that it is unsuitable for mass production.

Further, in the case of reaction systems using low-active aliphatic acid salts or organic zinc materials such as zinc halides, although ZnTe is generated, inadequate particles are formed or many structure defects are observed. Thus, there has been a problem that the refined nanoparticles usually exhibit no fluorescence.

In reported methods for producing ZnTe quantum dots giving narrow fluorescence FWHM, no fluorescence has been observed in safe methods capable of mass production.

The present invention is made in consideration of the above, and seeks to provide cadmium-free quantum dots with a narrow fluorescence FWHM.

Further, the present invention also seeks to provide a method of producing the quantum dots, by which the quantum dots are safely synthesized and mass-produced.

Solution to Problem

A quantum dot of the present invention does not contain Cd and has a fluorescence FWHM of 40 nm or less.

In the present invention, the quantum dot preferably has a fluorescence FWHM of 30 nm or less.

In the present invention, the quantum dot more preferably has a fluorescence FWHM of 25 nm or less.

In the present invention, the quantum dot is preferably a nanocrystal containing zinc (Zn) and tellurium (Te), or zinc (Zn) and tellurium (Te) and sulfur (S), or zinc (Zn) and tellurium (Te) and selenium (Se) and sulfur (S).

In the present invention, the quantum dot preferably has a core-shell structure in which the nanocrystal serves as a core and a surface of the core is coated with a shell.

In the present invention, the fluorescence wavelength of the quantum dot is preferably 400 nm or more and 650 nm or less.

In the present invention, the ligands are placed on the surface of the quantum dot.

In the present invention, the ligands are preferably comprised of one or two selected from aliphatic amine-based compounds, phosphine-based compounds, and aliphatic carboxylic acid-based compounds.

A wavelength converting member of the present invention contains the above-described quantum dot.

A lighting member of the present invention contains the above-described quantum dot.

A backlight unit of the present invention includes the above-described quantum dot.

A display device of the present invention includes the above-described quantum dot.

In a method of producing a quantum dot, according to the present invention, copper chalcogenide is preferably synthesized as a precursor from an organic copper compound or an inorganic copper compound, and an organic chalcogen compound; and a quantum dot free of Cd is preferably synthesized using the precursor.

In the present invention, metal exchange between copper and zinc in the precursor made of the copper chalcogenide is preferably performed.

In the present invention, the metal exchange reaction between copper (Cu) and zinc (Zn) is preferably performed at 180° C. or more and 280° C. or less. Further, the copper chalcogenide is preferably synthesized at a reaction temperature of 160° C. or more and 250° C. or less.

Advantageous Effects of Invention

According to the quantum dots of the present invention, quantum dots that are similar in particle shape and size can be synthesized, which makes it possible to reduce the fluorescence FWHM, leading to the improvement of color gamut.

Further, according to the method of producing quantum dots, of the present invention, Cd-free quantum dots with a narrow fluorescence FWHM can be safely synthesized by a method capable of mass production.

DESCRIPTION OF EMBODIMENTS

Embodiments of the present invention (hereinafter simply referred to as "embodiments") will now be described in detail. Note that the present invention is not limited to the following embodiments, and various modifications may be made without departing from the spirit of the present invention.

Figure 1A:
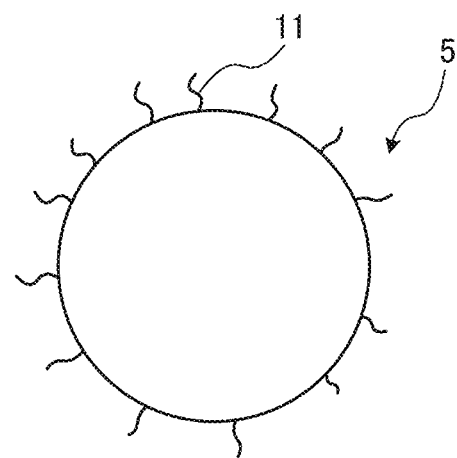
FIGS. 1A and 1B are schematic views of quantum dots according to an embodiment of the present invention.
Figure 1B:
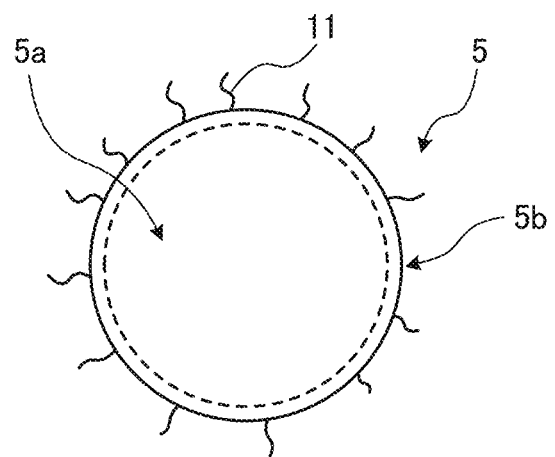

FIGS. 1A and 1B are schematic views of quantum dots according to this embodiment. A quantum dot 5 shown in FIG. 1A is a nanocrystal which does not contain Cd.

In this embodiment, the quantum dot 5 is preferably a nanocrystal containing zinc and tellurium (hereinafter referred to as Zn, Te) or zinc and tellurium and sulfur (hereinafter referred to as Zn, Te, S) or zinc and tellurium and selenium and sulfur (referred to as Zn, Te, Se, S). Further, the quantum dot 5 may be a nanocrystal containing zinc and tellurium and selenium. Alternatively, the quantum dot 5 may be a nanocrystal containing zinc and selenium.

The quantum dot 5 has fluorescence properties based on near band-edge emission, and the quantum size effect is achieved by the size of the particle.

Here, a "nanocrystal" refers to a nanoparticle having a particle size of around several nanometers to several tens of nanometers. In this embodiment, many quantum dots 5 can be formed to be approximately uniform in particle size.

Zn and Te or Zn and Te and S, Zn and Te and S and Se, or Zn and Se contained in the quantum dot 5 are main ingredients, and elements other than these elements may be contained. However, it is preferred that Cd is not contained, and phosphorus (P) is also not contained. Since an organic phosphorus compound is expensive and is easily oxidized in air, resulting in unstable synthesis; thus, the cost would be increased, the fluorescence characteristics will be unstable, and the production process would likely be complicated.

The quantum dot 5 of this embodiment has a fluorescence FWHM of 40 nm or less. "Fluorescence FWHM" herein refers to the full width at half maximum (FWHM) of the spread of the fluorescence wavelength at half the peak value of the fluorescence intensity in the fluorescence spectrum. Further, the fluorescence FWHM is preferably 30 nm or less. Still further, the fluorescence FWHM is preferably 28 nm or less. The fluorescence FWHM is more preferably 26 nm or less. The fluorescence FWHM is even more preferably 25 nm or less. The fluorescence FWHM is yet more preferably 23 nm or less. Thus, since the fluorescence FWHM can be made narrow, the color gamut can be improved. In this embodiment, as described below, for the reaction system for synthesizing the quantum dot 5, copper chalcogenide is synthesized as a precursor, followed by a metal exchange reaction on the precursor. When the quantum dot 5 is produced based on such an indirect synthetic reaction, the fluorescence FWHM can be made narrower; specifically, a fluorescence FWHM of 40 nm or less (preferably 30 nm or less) can be achieved.

As shown in FIG. 1A, many organic ligands 11 are preferably placed on the surface of the quantum dot 5. This can inhibit aggregation of quantum dots 5, resulting in the target optical properties. The ligands available for the reaction are not particularly limited; for example, the following ligands can be given as typical examples.

Aliphatic primary amines: oleylamine: $C_{18}H_{35}NH_2$, stearyl (octadecyl)amine: $C_{18}H_{37}NH_2$, dodecyl(lauryl)amine: $C_{12}H_{25}NH_2$, decylamine: $C_{10}H_{21}NH_2$, octylamine: $C_8H_{17}NH_2$ Aliphatic acids: oleic acid: $C_{17}H_{33}COOH$, stearic acid: $C_{17}H_{35}COOH$, palmitic acid: $C_{15}H_{31}COOH$, myristic acid: $C_{13}H_{27}COOH$, lauric acid: $C_{11}H_{23}COOH$, decanoic acid: $C_9H_{19}COOH$, octanoic acid: $C_7H_{15}COOH$ Thiols: octadecanethiol: $C_{18}H_{37}SH$, hexadecanethiol: $C_{16}H_{33}SH$, tetradecanethiol: $C_{14}H_{29}SH$, dodecanethiol: $C_{12}H_{25}SH$, decanethiol: $C_{10}H_{21}SH$, octanethiol: $C_8H_{17}SH$ Phosphines: trioctylphosphine: $(C_8H_{17})_3P$, triphenylphosphine: $(C_6H_5)_3P$, tributylphosphine: $(C_4H_9)_3P$ Phosphine oxides: trioctylphosphine oxide: $(C_8H_{17})_3P=O$, triphenylphosphine oxide: $(C_6H_5)_3P=O$, tributylphosphine oxide: $(C_4H_9)_3P=O$ In this embodiment, ligands are not limited to monofunctional small molecules; alternatively, difunctional trifunctional, tetrafunctional, or more functional multifunctional oligomers or polymers may be used.

The fluorescence quantum yield of the quantum dot 5 in this embodiment is 5% or more. Further, the fluorescence quantum yield is preferably 10% or more, more preferably 20% or more. Thus, in this embodiment, the fluorescence quantum yield of the quantum dot can be increased.

In this embodiment, the fluorescence wavelength can be freely controlled to around 400 nm or more and 650 nm or less. For example, the quantum dot 5 in this embodiment is a ZnTe-based solid solution using a chalcogen in addition to zinc. In this embodiment, the particle size of the quantum dot 5 and the composition of the quantum dot 5 can be adjusted to control the fluorescence wavelength from blue, green, yellow to red. Accordingly, the fluorescence wavelength is preferably 400 nm or more, more preferably 430 nm or more. Further, the fluorescence wavelength is preferably 650 nm or less for red emission, and more preferably 580 nm or more for green emission.

As described above, in this embodiment, the fluorescence wavelength can be controlled from blue to red; however, green emission or red emission is preferred when the quantum dot is used as a wavelength conversion material for a visible light region.

The quantum dot 5 depicted in FIG. 1B has a core-shell structure having a core 5a and a shell 5b covering the surface of the core 5a. As shown in FIG. 1B, many organic ligands 11 are preferably placed on the surface of the quantum dot 5. Further, the fluorescence FWHM of the quantum dot 5 shown in FIG. 1B is 40 nm or less. The fluorescence FWHM is preferably 30 nm or less.

The core 5a of the quantum dot 5 shown in FIG. 1B is the nanocrystal shown in FIG. 1A. Accordingly, the core 5a is preferably formed of ZnTe, ZnTeS, ZnTeSeS, ZnSe, or ZnSeS. As with the core 5a, the shell 5b does not contain cadmium (Cd) either. The material for forming the shell 5b may be, but not limited to, for example, zinc selenide (ZnSe), zinc sulfide (ZnS), etc.

The shell 5b may be in a condition of being a solid solution on the surface of the core 5a. In FIG. 1B, the boundary between the core 5a and the shell 5b is indicated by a dotted line, and this means that the boundary between the core 5a and the shell 5b may or may not be identified by an analysis.

As with FIG. 1A, the fluorescence wavelength of the quantum dot 5 shown in FIG. 1B can also be freely controlled to around 400 nm or more and 650 nm or less.

Subsequently, a method of producing the quantum dot 5 of this embodiment will be described.

First, in this embodiment, copper chalcogenide (precursor) is synthesized from an organic copper compound or an inorganic copper compound and an organic chalcogen compound. Specifically, the precursor is preferably copper telluride: $Cu_2Te$ or copper telluride sulfide: $Cu_2TeS$, copper telluride selenide sulfide: $Cu_2TeSeS$, copper selenide: $Cu_2Se$, or copper selenide sulfide: $Cu_2SeS$.

In this embodiment, although fluorescence is caused by a ZnTe core alone, in order to increase the fluorescence intensity of a quantum dot, S is preferably present as a solid solution in ZnTe. Accordingly, in the synthesis of $Cu_2Te$ as the precursor, a thiol is preferably added in amount of 1 to 50 equivalents of Te, and more preferably added in an amount of 5 to 20 equivalents to obtain quantum dots with higher fluorescence intensity. Thus, $Cu_2TeS$ or $Cu_2TeSeS$ can be obtained. Thiols include, but not limited to, for example, octadecanethiol: $C_{18}H_{37}SH$, hexadecanethiol: $C_{16}H_{33}SH$, tetradecanethiol: $C_{14}H_{29}SH$, dodecanethiol: $C_{12}H_{25}SH$, decanethiol: $C_{10}H_{21}SH$, and octanethiol: $C_8H_{17}SH$.

Here, in this embodiment, a raw material for Cu used for $Cu_2Te$ may be, but not limited to, for example, one of the following organic copper reagents and inorganic copper reagents. Specifically, for example, copper(I) acetate: Cu(OAc) or copper(II) acetate: $Cu(OAc)_2$ can be used as an acetate; copper stearate: $Cu(OC(=O)C_{17}H_{35})_2$, copper oleate: $Cu(OC(=O)C_{17}H_{33})_2$, copper myristate: $Cu(OC(=O)C_{13}H_{27})_2$, copper didodecanoate: $Cu(OC(=O)C_{11}H_{23})_2$, or copper acetylacetonate: $Cu(acac)_2$ can be used an aliphatic acid salt; and either a monovalent compound or a divalent compound, for example, copper(I) chloride: CuCl, copper(II) chloride: $CuCl_2$, copper(I) bromide: CuBr, copper (II) bromide: $CuBr_2$, copper(I) iodide: CuI, or copper(II) iodide: $CuI_2$ can be used as a halide.

In this embodiment, for tellurium, an organic tellurium compound (organic chalcogen compound) is used as a raw material. The structure of the compound is not particularly limited, and for example, trioctylphosphine telluride: $(C_8H_{17})_3P=Te$ in which tellurium is dissolved in trioctylphosphine, tributylphosphine telluride: $(C_4H_9)_3P=Te$ in which tellurium is dissolved in tributylphosphine, or the like can be used. Alternatively, dialkyl ditelluride: $R_2Te_2$ such as diphenylditelluride: $(C_6H_5)_2Te_2$ may be used.

In this embodiment, when selenium is added to form a solid solution, an organic selenium compound (organic chalcogen compound) is used as a raw material for selenium. The structure is not particularly limited; for example, trioctylphosphine selenide: $(C_8H_{17})_3P=Se$ in which selenium is dissolved in trioctylphosphine, tributylphosphine selenide: $(C_4H_9)_3P=Se$ in which selenium is dissolved in tributylphosphine, a solution in which selenium is dissolved in a high-boiling solvent that is a long-chain hydrocarbon such as octadecene, etc. at a high temperature can be used.

In this embodiment, an organic copper compound or an inorganic copper compound is mixed with an organic chalcogen compound to be dissolved. For a solvent, octadecene can be used as high-boiling saturated hydrocarbon or unsaturated saturated hydrocarbon. Other than the above, t-butylbenzene can be used as a high-boiling aromatic solvent, and butyl butyrate: $C_4H_9COOC_4H_9$, benzyl butyrate: $C_6H_5CH_2COOC_4H_9$, etc. can be used as a high-boiling ester solvent; alternatively, an aliphatic amine compound, an aliphatic acid compound, or an aliphatic phosphorus compound may be used as a solvent.

Here, copper chalcogenide (precursor) is synthesized with the reaction temperature being set to 160° C. or more and 250° C. or less. The reaction temperature is preferably as lower as 160° C. or more and 220° C. or less, more preferably even as lower as 160° C. or more and 200° C. or less.

Further, in this embodiment, the reaction process is not particularly limited; however, in order to obtain quantum dots with a narrow FWHM, it is important to synthesize $Cu_2Te$, $Cu_2TeS$, $Cu_2TeSeS$, $Cu_2Se$, or $Cu_2SeS$ of similar particle sizes. Accordingly, in the synthesis of $Cu_2Te$ that is the precursor or $Cu_2TeS$, $Cu_2TeSeS$, $Cu_2Se$, or $Cu_2SeS$; a mixed solution of a tellurium raw material solution; raw materials for tellurium and selenium; or a raw material for selenium is preferably quickly added to a heated organic copper raw material solution.

Further, in this embodiment, in order to obtain ZnTe or ZnSe of high fluorescence intensity as a core, it is important to mix sulfur (S) as a solid solution in the core. Accordingly, for example, in the synthesis of $Cu_2Te$ that is the precursor, a thiol is preferably added in amount of 1 to 50 equivalents of Te, and more preferably added in an amount of 5 to 20 equivalents to obtain quantum dots of high fluorescence intensity. Thiols include, but not limited to, for example, octadecanethiol: $C_{18}H_{37}SH$, hexadecanethiol: $C_{16}H_{33}SH$, tetradecanethiol: $C_{14}H_{29}SH$, dodecanethiol: $C_{12}H_{25}SH$, decanethiol: $C_{10}H_{21}SH$, and octanethiol: $C_8H_{17}SH$.

Next, as a raw material for ZnTe, ZnTeS, ZnTeSeS, or ZnSe; or ZnSeS, an organic zinc compound or an inorganic zinc compound is prepared. Organic zinc compounds and inorganic zinc compounds are materials that are stable and easy to handle even in air. The structure of the organic zinc compound or inorganic zinc compound is not limited; however, a highly ionic zinc compound is preferably used to efficiently perform a metal exchange reaction. For example, the following organic zinc compounds and inorganic zinc compounds can be used. Specifically, for example, zinc acetate: $Zn(OAc)_2$ or nitric acid zinc: $Zn(NO_3)_2$ can be used as an acetate; zinc stearate: $Zn(OC(=O)C_{17}H_{35})_2$, zinc oleate: $Zn(OC(=O)C_{17}H_{33})_2$, zinc palmitate: $Zn(OC(=O)C_{15}H_{31})_2$, zinc myristate: $Zn(OC(=O)C_{13}H_{27})_2$, zinc dodecanoate: $Zn(OC(=O)C_{11}H_{23})_2$, or zinc acetylacetonate: $Zn(acac)_2$ can be used as an aliphatic acid salt; zinc chloride: $ZnCl_2$, zinc bromide: $ZnBr_2$, or zinc iodide: $ZnI_2$ can be used as a halide; and zinc diethyldithiocarbamate: $Zn(SC(=S)N(C_2H_5)_2)_2$, zinc dimethyldithiocarbamate: $Zn(SC(=S)N(CH_3)_2)_2$, or zinc dibutyldithiocarbamate: $Zn(SC(=S)N(C_4H_9)_2)_2$ can be used as a zinc carbamate.

Subsequently, the above organic zinc compound or inorganic zinc compound is added to a reaction solution in which the precursor of copper chalcogenide is synthesized. This results in a metal exchange reaction between copper (Cu) in copper chalcogenide and zinc (Zn). The metal exchange reaction is preferably made to occur at 180° C. or more and 280° C. or less. The metal exchange reaction is more preferably made to occur at a lower temperature of 180° C. or more and 250° C. or less.

Further, in this embodiment, when the metal exchange is performed, a compound that serves to help isolate the metal of the precursor in the reaction solution by coordination, chelation, etc. is required.

Compounds playing the above role include ligands which can be complexed with copper. For example, phosphorus-based ligands, amine-based ligands, sulfur-based ligands are preferred; in particular, phosphorus-based ligands are preferred more because of its high efficiency.

Thus, metal exchange of Cu and Zn can be appropriately performed, and quantum dots having a narrow fluorescence FWHM based on Zn and Te or Zn and Se can be produced.

The metal exchange between Cu and Zn preferably proceeds quantitatively. In order to also improve the optical properties of ZnTe or ZeSe to be formed, the amount of Cu left in ZnTe or ZnSe is preferably reduced. The amount of Cu left is preferably 100 ppm, more preferably 50 ppm, and ideally 10 ppm or less.

In this embodiment, copper chalcogenide is synthesized as the precursor from an organic copper compound or an inorganic copper compound and an organic chalcogen compound, and metal exchange is performed using the precursor to synthesize quantum dots. Thus, in this embodiment, first, quantum dots are synthesized after the synthesis of the precursor; namely, ZnTe or ZnSe is not directly synthesized. Such an indirect synthesis method renders it unnecessary to use regents that are excessively reactive and so dangerous to handle, and ZnTe-based quantum dots or ZnSe-based quantum dots having a narrow FWHM can be safely and stably synthesized.

Further, in this embodiment, desired quantum dots can be obtained by subjecting Cu—Zn to metal exchange by one-pot synthesis without isolating and purifying the precursor.

Further, in this embodiment, even if processes such as cleaning, isolation/purification, coating, and ligand exchange are not performed, the synthesized quantum dots exhibit fluorescent properties.

However, as shown in FIG. 1B, the core 5a made of a nanocrystal such as of ZnTe or ZnTeS, or ZnTeSeS is coated by the shell 5b, thereby further increasing the fluorescence quantum yield.

Further, in this embodiment, the core/shell structure can be synthesized in the stage of the precursor. For example, when zinc selenide (ZnSe) is used for the shell structure, copper chalcogenide of the precursor is $Cu_2Te/Cu_2Se$. This is synthesized by continuously adding the raw materials for Te and the Se in one reaction vessel, followed by metal exchange of Cu—Zn, thereby obtaining ZnTe/ZnSe.

In this embodiment, metal exchange of Cu—Zn is performed using $Cu_2Te$, $Cu_2TeS$, or $Cu_2TeSeS$ as a precursor; thus, not only is a nanocrystal of ZnTe, ZnTeS, or ZnTeSeS synthesized, but also ZnTe/ZnSe having a core/shell structure can be synthesized by performing metal exchange of Cu—Zn using for example $Cu_2Te/Cu_2Se$ as the precursor. Similarly, one-pot synthesis of a solid solution having a core/shell structure is also possible.

In this embodiment, $Cu_2Te$, or $Cu_2TeS$ or $Cu_2TeSeS$ is chiefly used as the precursor; alternatively, $Cu_2Se$, $Cu_2SeS$, or $Cu_2S$ may be used to perform metal exchange of Cu—Zn in a similar manner, thereby obtaining a nanocrystal of such as ZnSe, ZnSeS, or ZnS.

Some specific examples are given below; however, the uses of the quantum dot 5 shown in FIGS. 1A and 1B are not particularly limited thereto.

Figure 2:
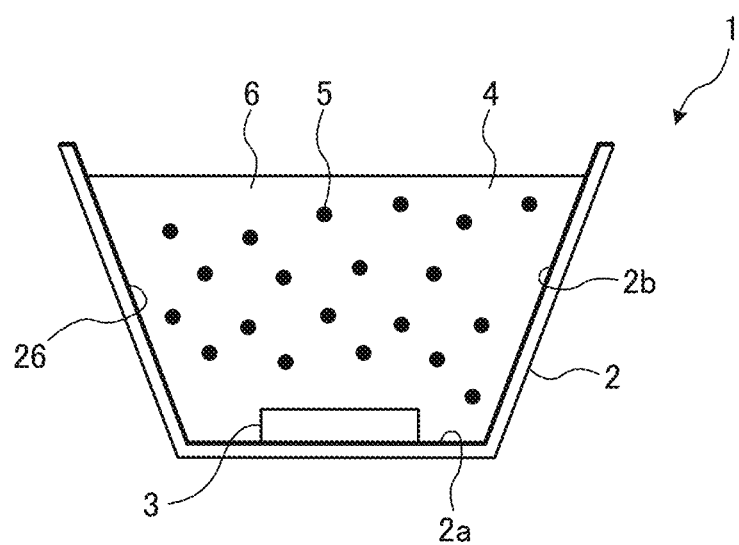
FIG. 2 is a schematic view of an LED device using nanocrystals according to an embodiment of the present invention.

FIG. 2 is a schematic view of an LED device using quantum dots according to this embodiment. An LED apparatus 1 of this embodiment is configured to have a containment case 2 having a bottom 2a and a side wall 2b surrounding the perimeter of the bottom 2a, an LED chip (light emitting device) 3 placed on the bottom 2a of the containment case 2, and a fluorescent layer 4 with which the containment case 2 is filled to stop the top side of the LED chip 3 as shown in FIG. 2. Here, the top side corresponds to the direction in which light emitted from the LED chip 3 exits the containment case 2, the direction being opposite to the bottom 2a with respect to the LED chip 3.

The LED chip 3 may be placed on a base wiring board not shown, and the base wiring board may constitute the bottom portion of the containment case 2. As the base board, for example, a structure in which a wiring pattern is formed on a substrate such as a glass epoxy resin can be given.

The LED chip 3 is a semiconductor device that emits light when a voltage is applied in the forward direction, and has a basic structure in which a P-type semiconductor layer and an N-type semiconductor layer form a PN junction.

As shown in FIG. 2, the fluorescent layer 4 is formed from a resin 6 in which many quantum dots 5 are dispersed.

Further, a resin composition in which the quantum dots 5 in this embodiment are dispersed may contain quantum dots 5 and luminescent materials in addition to the quantum dots 5. Fluorescent materials include SiAlON-based fluorescent materials and a KSF($K_2SiF_6:Mn^{4+}$) red fluorescent material; however, the material is not limited thereto.

The resin 6 forming the fluorescence layer 4 is not limited, and polypropylenes (Polypropylene: PP), polystyrenes (PS), acrylic resins, methacrylates, MS resin, polyvinyl chloride (PVC), polycarbonates (PC), polyethylene terephthalate (PET), polyethylene naphthalate (PEN), polymethylpentene, liquid crystal polymers, epoxy resins, silicone resins, or a mixture of these can be used.

Figure 3:
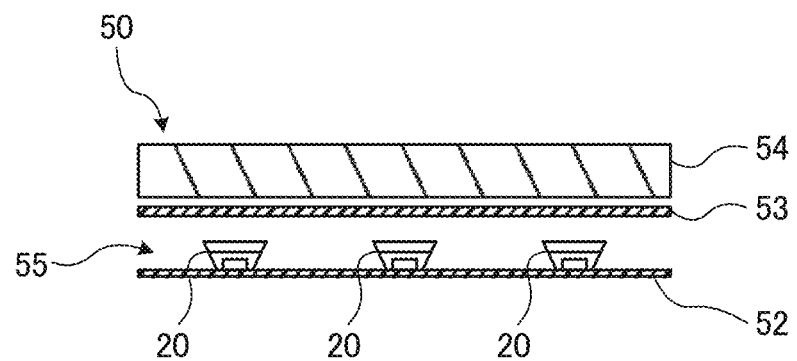
FIG. 3 is a longitudinal sectional view of a display device using the LED device shown in FIG. 2.

The LED device using quantum dots in this embodiment can be applied to a display device. FIG. 3 is a longitudinal sectional view of a display device using the LED device shown in FIG. 2. As shown in FIG. 3, a display device 50 is configured to have a plurality of LED devices 20 and a display area 54 such as a liquid crystal display facing the LED devices 20. The LED devices 20 are placed on the back side of the display area 54. As with the LED device 1 depicted in FIG. 2, each LED device 20 has a structure in which an LED chip is encapsulated in a resin in which many quantum dots 5 are diffused.

As shown in FIG. 3, the plurality of LED devices 20 are supported by a support body 52. The LED devices 20 are arranged at predetermined intervals. The LED devices 20 and the support body 52 constitute a back light 55 for the display area 54. The shape and the material of the support body 52 are not limited, and the support body 52 can be shaped, for example, like a sheet, a plate, or a case. As shown in FIG. 3, a light diffusion plate 53, etc. may be provided between the back light 55 and the display area 54.

When the quantum dot 5 having a narrow fluorescence FWHM in this embodiment is applied to the LED device shown in FIG. 2, the display device shown in FIG. 3, etc., the light emission properties of the device can be effectively improved.

EXAMPLES

The effects of the present invention will be described using Examples and Comparative Examples. Note that the present invention is not limited to the following examples in any way.

<Raw Materials>

In the present invention, the following raw materials were used to synthesize quantum dots free of cadmium.

Solvent

Octadecene: product of Sigma-Aldrich Co. LLC/Idemitsu Kosan Co., Ltd.

Oleylamine: product of Kao Corporation

Oleic acid: product of Kao Corporation

Zinc chloride: product of Sigma-Aldrich Co. LLC

Zinc iodide: product of Sigma-Aldrich Co. LLC

Zinc acetate dihydrate: product of IKOMA chemical products Co. Ltd.

Anhydrous zinc acetate: product of Sigma-Aldrich Co. LLC

Tellurium (4N: 99.99%): product of Shinko Chemical Co., Ltd. or Sigma-Aldrich Co. LLC Selenium (4N: 99.99%): product of Shinko Chemical Co., Ltd. or Sigma-Aldrich Co. LLC Sulfur: product of KISHIDA CHEMICAL Co., Ltd.

Trioctylphosphine: product of HOKKO CHEMICAL INDUSTRY CO., LTD.

Trioctylphosphine oxide: product of Sigma-Aldrich Co. LLC

Tetradecane: product of Tokyo Chemical Industry Co., Ltd. (TCI)

Triphenyl phosphite: product of Sigma-Aldrich Co. LLC

Hexadecylamine: product of NOF CORPORATION

Dodecanethiol: product of Arkema S.A.

<Measurement System>

Spectrofluorometer: F-2700 produced by Hitachi High-Tech Science Corporation

Ultraviolet-visible spectrophotometer: V-770 produced by JASCO Corporation

Quantum yield measurement system: QE-1100 produced by Otsuka Electronics Co., Ltd.

X-ray diffraction (XRD) system: D2 PHASER produced by Bruker Corporation
Scanning electron microscope (SEM): SU9000 produced by Hitachi High-Tech Science Corporation

Example 1

Into a 100 mL reaction vessel, 36.3 mg of anhydrous copper acetate: $Cu(OAc)_2$, 0.5 mL of dodecanethiol: DDT, 0.1 mL of oleylamine: OLAm, and 4 mL of octadecene: ODE were charged. After that, heating was performed while stirring in an inert gas ($N_2$) atmosphere, thereby dissolving the raw materials.

To this solution, 0.2 mL of a trioctylphosphine telluride: Te-TOP solution (0.5M) was added, and heating was performed while stirring at 220° C. for 10 minutes. The resultant reaction solution ($Cu_2Te$) was cooled to room temperature.

After that, 273 mg of zinc chloride: $ZnCl_2$, 3 mL of trioctylphosphine: TOP, and 0.1 mL of oleylamine: OLAm were added to the reaction solution, and heating was performed while stirring in an inert gas ($N_2$) atmosphere at 220° C. for 30 minutes.

Figure 4:
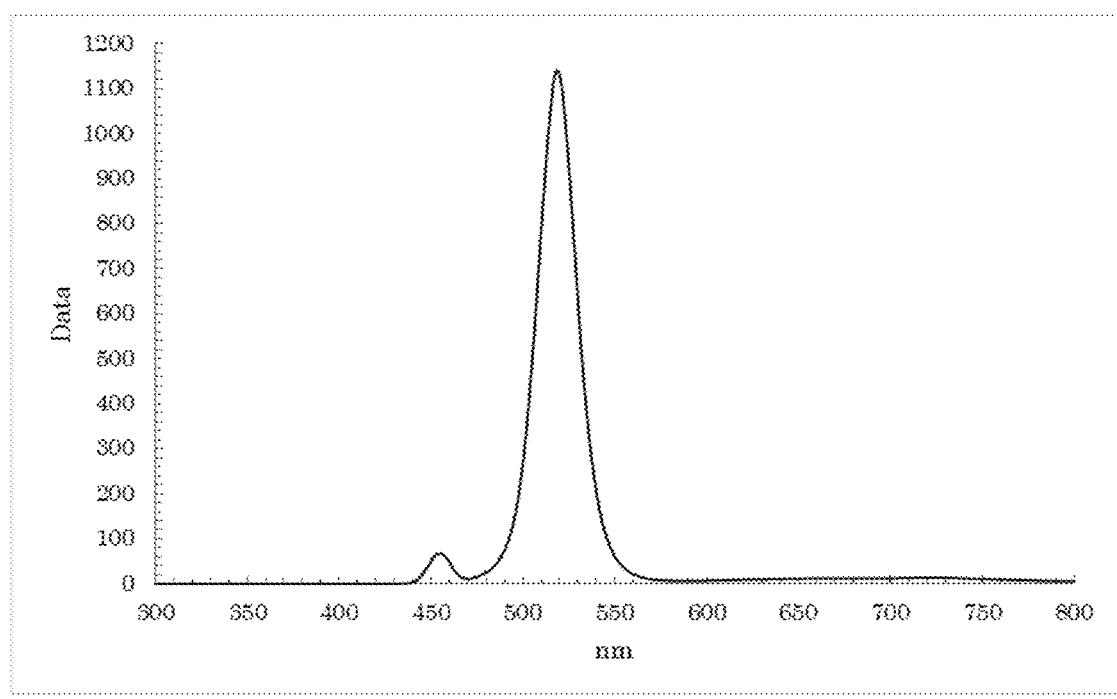
FIG. 4 shows a fluorescence (photoluminescence: PL) spectrum exhibited by ZnTe in Example 1.

The resultant reaction solution was subjected to a measurement using the spectrofluorometer. Thus, as shown in FIG. 4, a fluorescence wavelength of approximately 518.5 nm and a fluorescence FWHM of approximately 24.3 nm were obtained as optical properties.

Further, ethanol was added to the resultant reaction solution to cause precipitation, and centrifugal separation was performed to recover the precipitate. Toluene was then added to disperse the precipitate, thereby obtaining a dispersion solution in which ZnTe particles were dispersed.

Example 2

Into a 100 mL reaction vessel, 36.3 mg of anhydrous copper acetate: $Cu(OAc)_2$, 63.8 μL of hexadecanethiol: HDT, 0.1 mL of oleylamine: OLAm, and 10 mL of octadecene: ODE were charged. After that, heating was performed while stirring in an inert gas ($N_2$) atmosphere, thereby dissolving the materials.

To this solution, 0.2 mL of a trioctylphosphine telluride: Te-TOP solution (0.5M) was added, and heating was performed while stirring at 200° C. for 10 minutes.

The resultant reaction solution was cooled to room temperature. After that, 273 mg of zinc chloride: $ZnCl_2$, 3 mL of trioctylphosphine: TOP, and 0.1 mL of oleylamine: OLAm were added to the reaction solution. Heating was then performed while stirring in an inert gas ($N_2$) atmosphere at 250° C. for 15 minutes.

Figure 5:
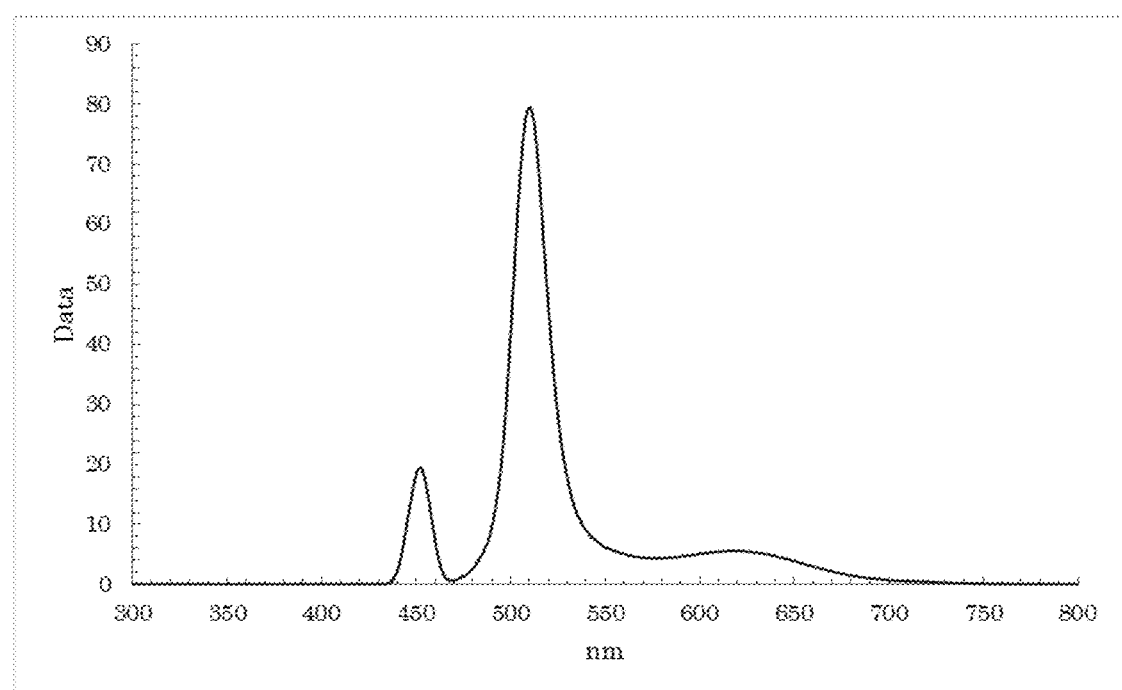
FIG. 5 shows a PL spectrum exhibited by ZnTe in Example 2.

As a result of a measurement on the resultant reaction solution using the spectrofluorometer, as shown in FIG. 5, a fluorescence wavelength of approximately 510.0 nm and a fluorescence FWHM of approximately 22.3 nm were obtained as optical properties.

Further, ethanol was added to the resultant reaction solution to cause precipitation, and centrifugal separation was performed to recover the precipitate. Toluene was then added to disperse the precipitate, thereby obtaining a dispersion solution in which ZnTe particles were dispersed.

Example 3

Into a 100 mL reaction vessel, 36.3 mg of anhydrous copper acetate: $Cu(OAc)_2$ and 5 mL of dodecanethiol: DDT were charged. After that, heating was performed while stirring in an inert gas ($N_2$) atmosphere, thereby dissolving the materials.

To this solution, 0.2 mL of a trioctylphosphine telluride: Te-TOP solution (0.5M) was added, and heating was performed while stirring at 220° C. for 20 minutes. The resultant reaction solution was cooled to room temperature. After that, 273 mg of zinc chloride: $ZnCl_2$, 3 mL of trioctylphosphine: TOP, and 0.2 mL of oleylamine: OLAm were added to the reaction solution. Heating was then performed while stirring at 220° C. for 30 minutes in an inert gas ($N_2$) atmosphere.

Figure 6:
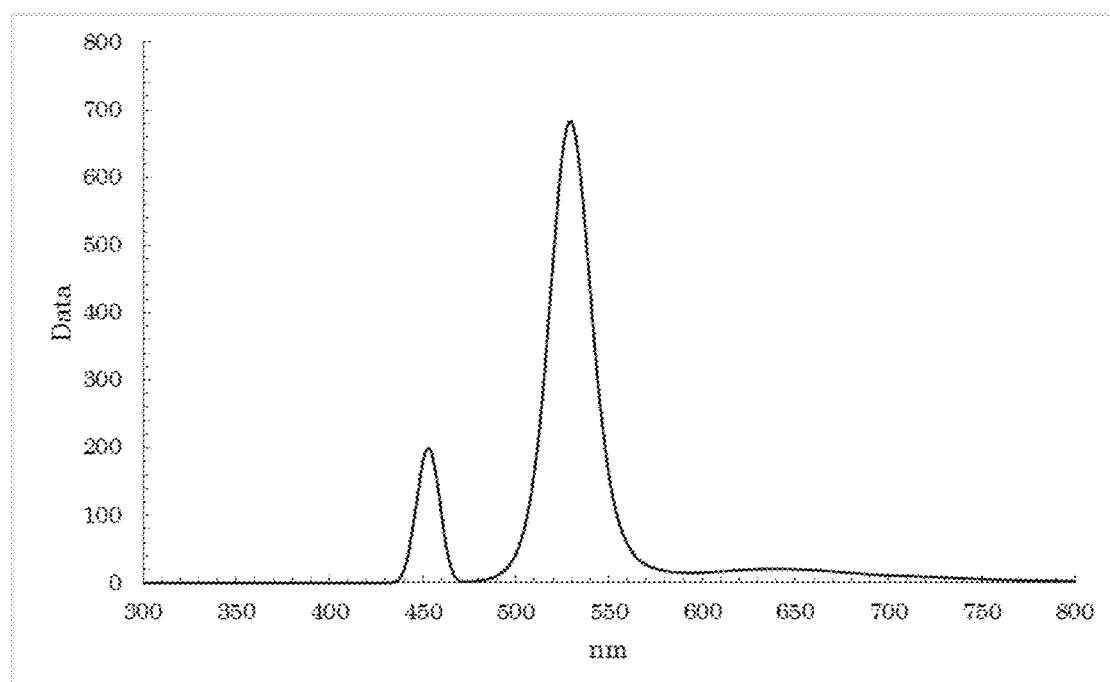
FIG. 6 shows a PL spectrum exhibited by ZnTeS in Example 3.

As a result of a measurement on the resultant reaction solution using the spectrofluorometer, as shown in FIG. 6, a fluorescence wavelength of approximately 529.5 nm and a fluorescence FWHM of approximately 26.1 nm were obtained as optical properties.

Ethanol was added to the resultant reaction solution to cause precipitation, and centrifugal separation was performed to recover the precipitate. Toluene was then added to disperse the precipitate, thereby obtaining a solution containing ZnTeS particles.

Example 4

Into a 100 mL reaction vessel, 72.7 mg of anhydrous copper acetate: $Cu(OAc)_2$, 0.4 mL of a trioctylphosphine telluride: Te-TOP solution (0.5M), 0.2 mL of a trioctylphosphine selenide: Se-TOP solution (1M), 1 mL of dodecanethiol: DDT, and 8 mL of octadecene: ODE were charged, and the materials were dissolved by heating while stirring in an inert gas ($N_2$) atmosphere.

This solution was heated while stirring at 220° C. for 10 minutes, followed by the addition of 0.2 mL of oleylamine: OLAm, and heating was then performed while stirring at 220° C. for 5 minutes. The resultant reaction solution was cooled to room temperature. After that, 546 mg of zinc chloride: $ZnCl_2$, 6 mL of trioctylphosphine: TOP, and 0.2 mL of oleylamine: OLAm were added to the reaction solution, and heating was performed while stirring in an inert gas ($N_2$) atmosphere at 220° C. for 30 minutes.

Figure 7:
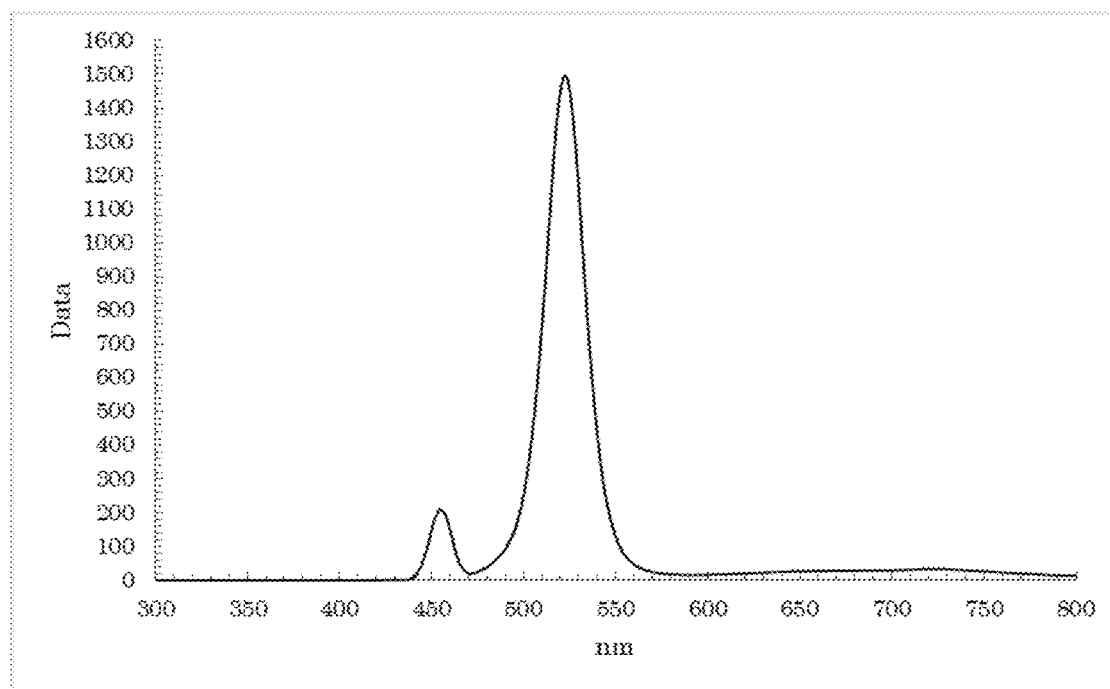
FIG. 7 shows a PL spectrum exhibited by ZnTeSeS in Example 4.

As a result of a measurement on the resultant reaction solution using the spectrofluorometer, a fluorescence wavelength of 522.5 nm and a fluorescence FWHM of 24.9 nm were obtained as optical properties (FIG. 7).

Ethanol was added to the resultant reaction solution to cause precipitation, and centrifugal separation was performed to recover the precipitate. Toluene was added to disperse the precipitate, thereby obtaining a dispersion solution in which ZnTeSeS particles were dispersed.

Example 5

Into a 100 mL reaction vessel, 36.3 mg of anhydrous copper acetate: $Cu(OAc)_2$, 0.2 mL of a trioctylphosphine telluride: Te-TOP solution (0.5M), 0.5 mL of dodecanethiol: DDT, and 4 mL of octadecene: ODE were charged, and the materials were dissolved by heating while stirring in an inert gas ($N_2$) atmosphere.

This solution was heated while stirring at 180° C. for 10 minutes, followed by the addition of 0.1 mL of oleylamine: OLAm, and heating was then performed while stirring at 180° C. for 5 minutes. The resultant reaction solution was cooled to room temperature. After that, 273 mg of zinc chloride: $ZnCl_2$, 3 mL of trioctylphosphine: TOP, and 0.1 mL of oleylamine: OLAm were added to the reaction solution, and heating was performed while stirring in an inert gas (N$_2$) atmosphere at 220° C. for 30 minutes.

This solution was cooled to room temperature, 546 mg of zinc chloride: ZnCl$_2$ was charged, and heating was performed in an inert gas (N$_2$) atmosphere at 220° C. for 60 minutes.

Figure 8:
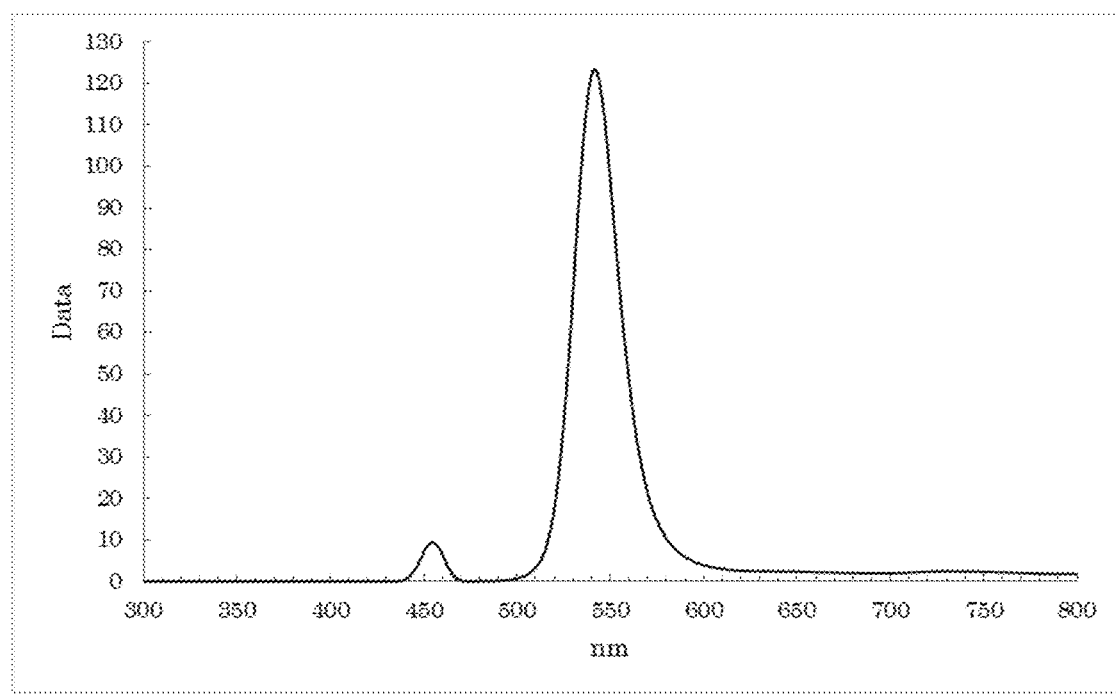
FIG. 8 shows a PL spectrum exhibited by ZnTe in Example 5.

As a result of a measurement on the resultant reaction solution using the spectrofluorometer, a fluorescence wavelength of 542.0 nm and a fluorescence FWHM of 27.8 nm were obtained as optical properties (FIG. 8).

Ethanol was added to the resultant reaction solution to cause precipitation, and centrifugal separation was performed to recover the precipitate. Toluene was added to disperse the precipitate, thereby obtaining a dispersion solution in which ZnTe particles were dispersed.

Example 6

Into a 100 mL reaction vessel, 36.3 mg of anhydrous copper acetate: Cu(OAc)$_2$, 0.2 mL of a trioctylphosphine telluride: Te-TOP solution (0.5M), and 4 mL of dodecanethiol: DDT were charged, and the materials were dissolved by heating while stirring in an inert gas (N$_2$) atmosphere.

This solution was heated while stirring at 220° C. for 10 minutes, followed by the addition of 0.1 mL of oleylamine: OLAm, and heating was then performed while stirring at 220° C. for 10 minutes. The resultant reaction solution was cooled to room temperature. Ethanol was added to the resultant reaction solution to cause precipitation, and centrifugal separation was performed to recover the precipitate. ODE in an amount of 4 mL and 0.1 mL of OLAm were added to disperse the precipitate, thereby obtaining a dispersion solution in which CuTe(S) particles were dispersed.

After that, 273 mg of zinc chloride: ZnCl$_2$ and 3 mL of trioctylphosphine: TOP were added to the reaction solution, and heating was performed while stirring in an inert gas (N$_2$) atmosphere at 220° C. for 20 minutes. Further, 0.5 mL of a zinc octanoate solution (0.2M) was added, and stirring was continuously performed at 220° C. for 10 minutes. Zinc octanoate was further added, and a process of heating and stirring was performed twice in total.

Figure 9:
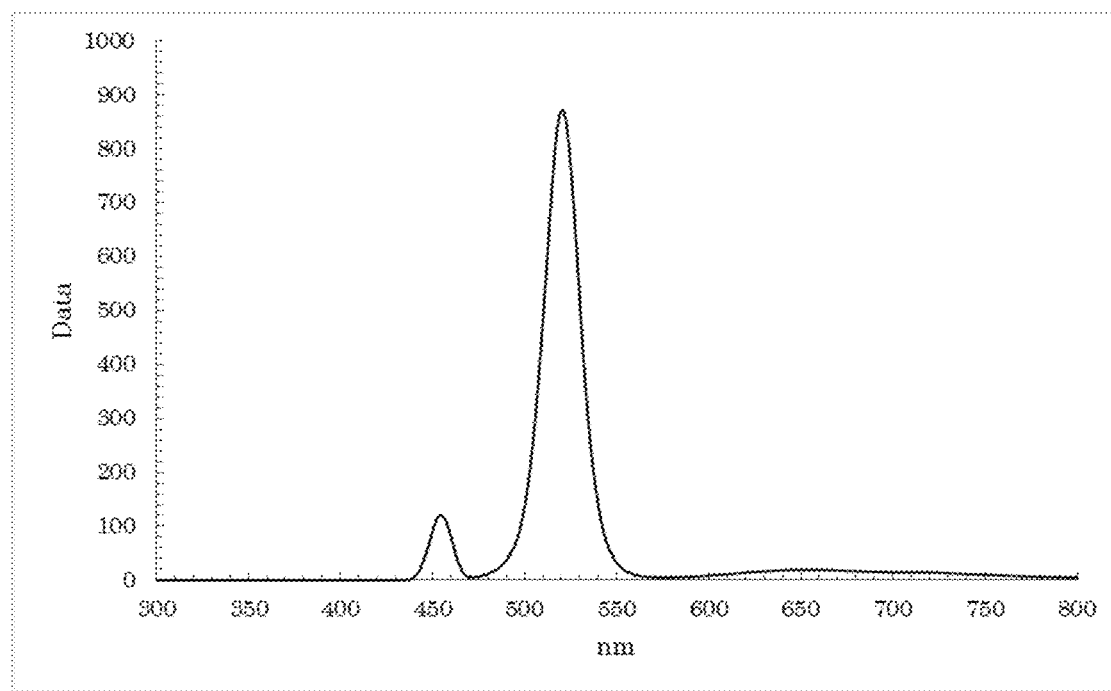
FIG. 9 shows a PL spectrum exhibited by ZnTeS in Example 6.

As a result of a measurement on the resultant reaction solution using the spectrofluorometer, a fluorescence wavelength of 520.5 nm and a fluorescence FWHM of 22.4 nm were obtained as optical properties (FIG. 9).

Ethanol was added to the resultant reaction solution to cause precipitation, and centrifugal separation was performed to recover the precipitate. Toluene was added to disperse the precipitate, thereby obtaining a dispersion solution in which ZnTeS particles were dispersed.

Example 7

Into a 100 mL reaction vessel, 0.091 g of anhydrous copper acetate: Cu(OAc)$_2$, 0.625 mL of dodecanethiol: DDT, 0.625 mL of trioctylphosphine: TOP, 0.194 g of trioctylphosphine oxide: TOPO, and 10 mL of tetradecane were charged, and the materials were dissolved by heating while stirring in an inert gas (N$_2$) atmosphere.

To this solution, 0.5 mL of a trioctylphosphine telluride: Te-TOP solution (0.5M) and 0.125 mL of oleylamine: OLAm were added, and heating was performed while stirring at 200° C. for 15 minutes. The resultant reaction solution was cooled to room temperature. After that, 0.685 g of zinc chloride: ZnCl$_2$, 7.5 mL of trioctylphosphine: TOP, 0.25 mL of oleylamine: OLAm, and 0.066 mL of triphenyl phosphite were added to the reaction solution, and heating was performed while stirring in an inert gas (N$_2$) atmosphere at 220° C. for 30 minutes. Further, 1.25 mL of a zinc octanoate solution (0.1M) was added, and stirring was continuously performed at 220° C. for 10 minutes. Zinc octanoate was further added, and a process of heating and stirring was performed twice in total.

Figure 13:
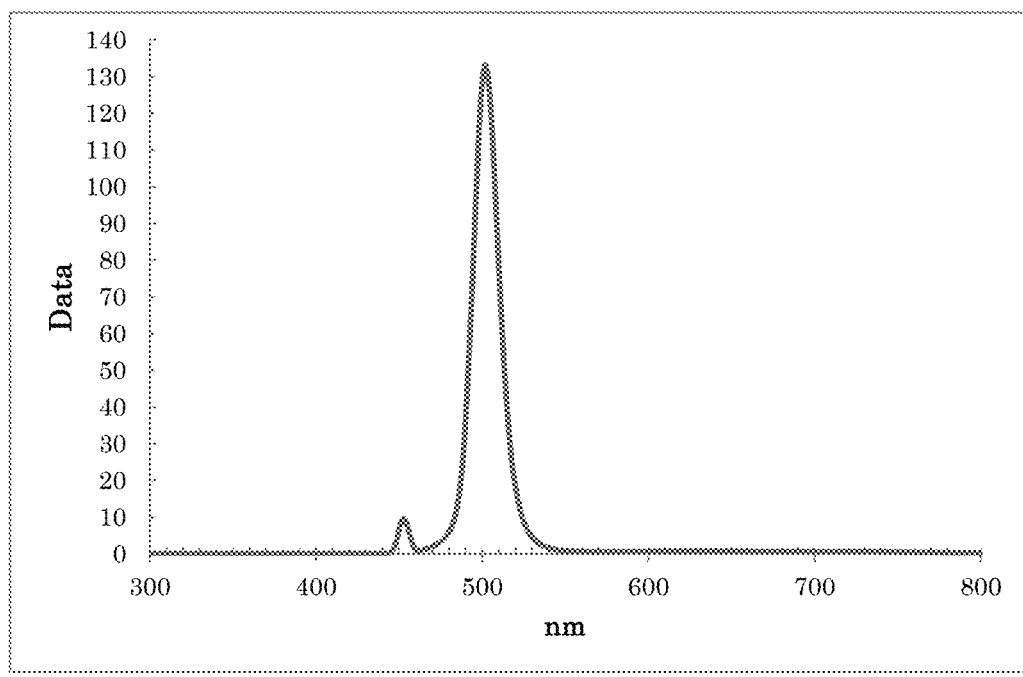
FIG. 13 shows a PL spectrum exhibited by ZnTe in Example 7.

As a result of a measurement on the resultant reaction solution using the spectrofluorometer, a fluorescence wavelength of 502.0 nm and a fluorescence FWHM of 17.9 nm were obtained as optical properties (FIG. 13).

Ethanol was added to the resultant reaction solution to cause precipitation, and centrifugal separation was performed to recover the precipitate. Toluene was added to disperse the precipitate, thereby obtaining a dispersion solution in which ZnTe particles were dispersed.

Example 8

Into a 100 mL reaction vessel, 0.8 mL of copper oleate: Cu(OLAc)$_2$ (0.5M), 0.4 mL of a trioctylphosphine telluride: Te-TOP solution (0.5M), 2 mL of a Se-ODE solution (0.1M), 1 mL of dodecanethiol: DDT, and 6.2 mL of octadecene: ODE were charged, and the materials were dissolved by heating while stirring in an inert gas (N$_2$) atmosphere.

This solution was heated while stirring at 220° C. for 10 minutes, followed by the addition of 0.2 mL of oleylamine: OLAm, and heating was then performed while stirring at 220° C. for 5 minutes. The resultant reaction solution was cooled to room temperature. After that, 0.546 g of zinc chloride: ZnCl$_2$, 6 mL of trioctylphosphine: TOP, and 0.2 mL of oleylamine: OLAm were added to the reaction solution, and heating was performed while stirring in an inert gas (N$_2$) atmosphere at 220° C. for 30 minutes. Further, 0.5 mL of a zinc octanoate solution (0.2M) was added, and stirring was continuously performed at 220° C. for 10 minutes. Zinc octanoate was further added, and a process of heating and stirring was performed twice in total.

Figure 14:
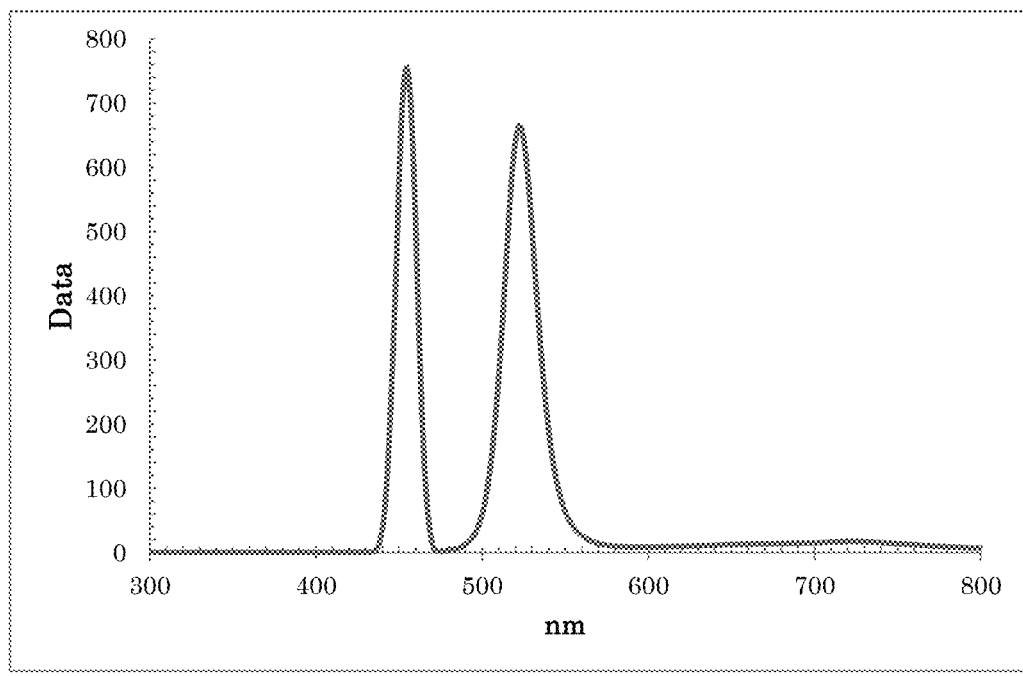
FIG. 14 shows a PL spectrum exhibited by ZnTeSe in Example 8.

As a result of a measurement on the resultant reaction solution using the spectrofluorometer, a fluorescence wavelength of 522.5 nm and a fluorescence FWHM of 23.1 nm were obtained as optical properties (FIG. 14).

Ethanol was added to the resultant reaction solution to cause precipitation, and centrifugal separation was performed to recover the precipitate. Toluene was added to disperse the precipitate, thereby obtaining a dispersion solution in which ZnTeSe particles were dispersed.

Example 9

Into a 100 mL reaction vessel, 0.182 g of anhydrous copper acetate: Cu(OAc)$_2$, 1 mL of a trioctylphosphine telluride: Te-TOP solution (0.5M), 0.439 mL of a Se-DDT/OLAm (0.285M), 2.5 mL of dodecanethiol: DDT, 0.25 mL of oleylamine: OLAm, 0.387 g of trioctylphosphine oxide: TOPO, and 20 mL of octadecene: ODE were charged, and the materials were dissolved by heating while stirring in an inert gas (N$_2$) atmosphere.

This solution was heated while stirring at 180° C. for 20 minutes. The resultant reaction solution was cooled to room temperature. After that, 1.37 g of zinc chloride: ZnCl$_2$, 15 mL of trioctylphosphine: TOP, and 0.5 mL of oleylamine: OLAm were added to the reaction solution, and heating was performed while stirring in an inert gas (N$_2$) atmosphere at 220° C. for 30 minutes. Further, 2.5 mL of a zinc octanoate solution (0.1M) was added, and stirring was continuously performed at 220° C. for 10 minutes. Zinc octanoate was further added, and a process of heating and stirring was performed twice in total.

Figure 15:
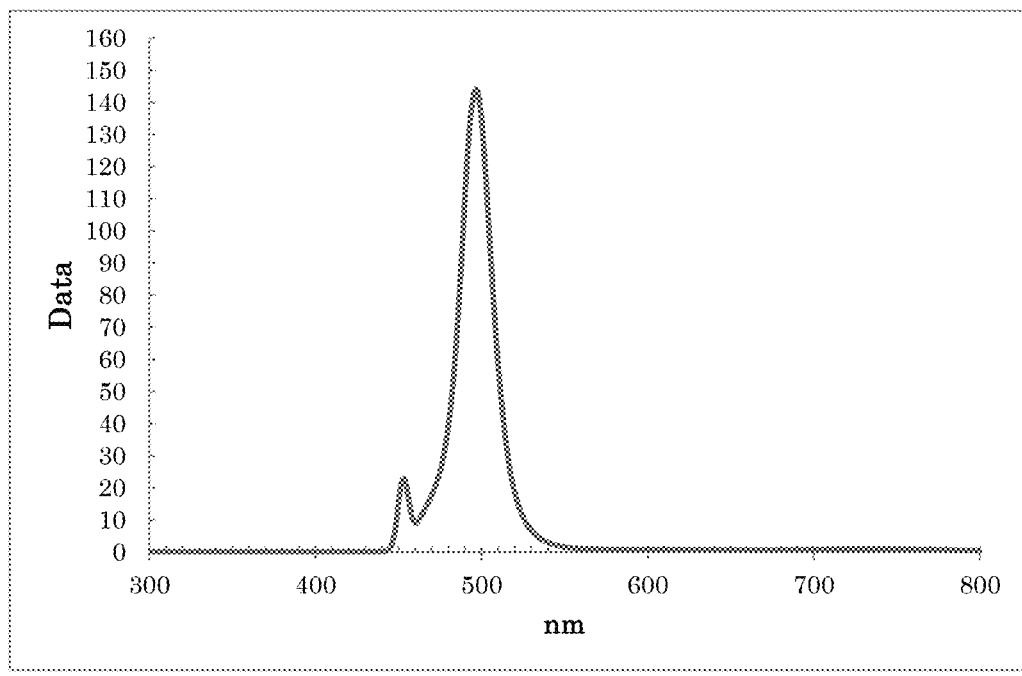
FIG. 15 shows a PL spectrum exhibited by ZnTeSe in Example 9.

As a result of a measurement on the resultant reaction solution using the spectrofluorometer, a fluorescence wavelength of 496.5 nm and a fluorescence FWHM of 21.3 nm were obtained as optical properties (FIG. 15).

Ethanol was added to the resultant reaction solution to cause precipitation, and centrifugal separation was performed to recover the precipitate. Toluene was added to disperse the precipitate, thereby obtaining a dispersion solution in which ZnTeSe particles were dispersed.

Example 10

Into a 100 mL reaction vessel, 0.091 g of anhydrous copper acetate: $Cu(OAc)_2$, 0.625 mL of dodecanethiol: DDT, 0.625 mL of trioctylphosphine: TOP, 0.194 g of trioctylphosphine oxide: TOPO, and 10 mL of octadecene: ODE were charged, and the materials were dissolved by heating while stirring in an inert gas ($N_2$) atmosphere.

To this solution, 0.5 mL of a trioctylphosphine telluride: Te-TOP solution (0.5M), 0.25 mL of a Se-TOP solution (1M), and 0.125 mL of oleylamine: OLAm were added, and heating was performed while stirring at 180° C. for 20 minutes. The resultant reaction solution was cooled to room temperature. After that, 0.685 g of zinc chloride: $ZnCl_2$, 7.5 mL of trioctylphosphine: TOP, 0.25 mL of oleylamine: OLAm, and 0.066 mL of triphenyl phosphite were added to the reaction solution, and heating was performed while stirring in an inert gas ($N_2$) atmosphere at 220° C. for 30 minutes. Further, 1.25 mL of zinc octanoate solution (0.1M) was added, and stirring was continuously performed at 220° C. for 10 minutes. Zinc octanoate was further added, and a process of heating and stirring was performed twice in total.

Figure 16:
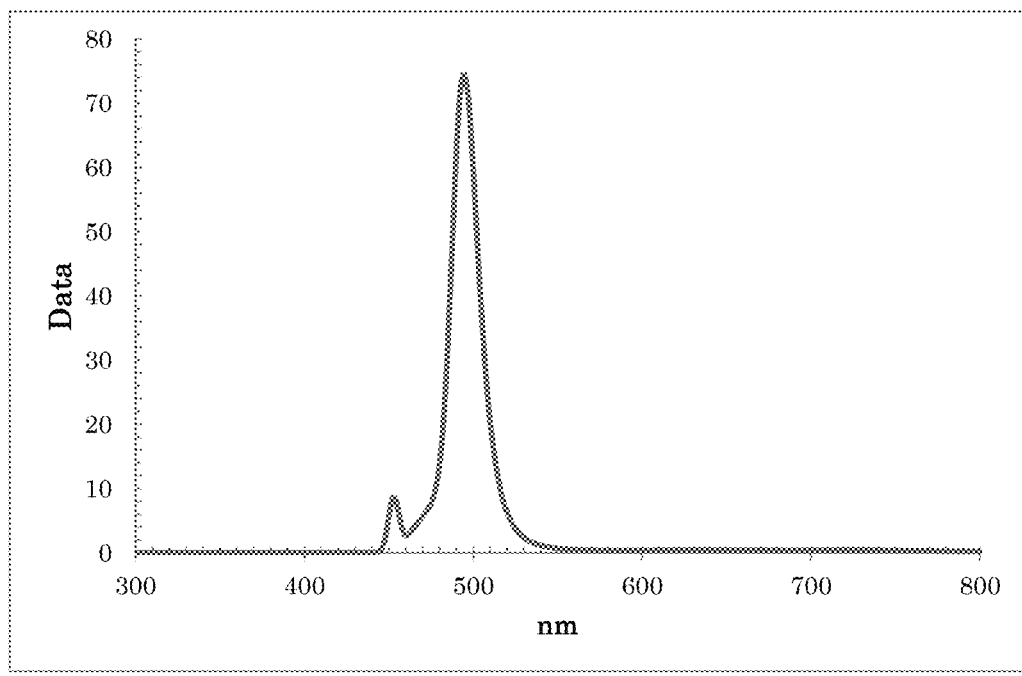
FIG. 16 shows a PL spectrum exhibited by ZnTeSe in Example 10.

As a result of a measurement on the resultant reaction solution using the spectrofluorometer, a fluorescence wavelength of 495.0 nm and a fluorescence FWHM of 18.7 nm were obtained as optical properties (FIG. 16).

Ethanol was added to the resultant reaction solution to cause precipitation, and centrifugal separation was performed to recover the precipitate. Toluene was added to disperse the precipitate, thereby obtaining a dispersion solution in which ZnTeSe particles were dispersed.

Example 11

Into a 100 mL reaction vessel, 0.091 g of anhydrous copper acetate: $Cu(OAc)_2$, 1.25 mL of dodecanethiol: DDT, 0.625 mL of trioctylphosphine: TOP, and 10 mL of octadecene: ODE were charged, and the materials were dissolved by heating while stirring in an inert gas ($N_2$) atmosphere.

To this solution, 0.5 mL of a trioctylphosphine telluride: Te-TOP solution (0.5M) and 0.125 mL of oleylamine: OLAm were added, and heating was performed while stirring at 200° C. for 15 minutes. Further, 1.25 mL of a Se-ODE solution (0.1M) was added and stirring was continuously performed at 200° C. for 15 minutes. A Se-ODE solution (0.1M) was further added; a process of heating and stirring was performed twice in total; and the resultant reaction solution was cooled to room temperature. After that, 0.685 g of zinc chloride: $ZnCl_2$, 7.5 mL of trioctylphosphine: TOP, and 0.25 mL of oleylamine: OLAm were added to the reaction solution, and heating was performed while stirring in an inert gas ($N_2$) atmosphere at 220° C. for 30 minutes. Further, 1.25 mL of a zinc octanoate solution (0.1M) was added, and stirring was continuously performed at 220° C. for 10 minutes. Zinc octanoate was further added, and a process of heating and stirring was performed twice in total.

After the resultant reaction solution was cooled to room temperature, toluene and ethanol were added to cause precipitation, and centrifugal separation was performed to recover the precipitate. Octadecene: ODE was added in an amount of 11 mL to disperse the precipitate, thereby obtaining a dispersion solution in which ZnTe/ZnSe particles were dispersed in ODE.

To the resultant ODE dispersion solution, 0.685 g of zinc chloride: $ZnCl_2$, 7.5 mL of trioctylphosphine: TOP, and 0.25 mL of oleylamine: OLAm were added, and heating was performed while stirring in an inert gas ($N_2$) atmosphere at 220° C. for 30 minutes. Further, 1.25 mL of a zinc octanoate solution (0.1M) was added, and stirring was continuously performed at 220° C. for 10 minutes. Zinc octanoate was further added, and a process of heating and stirring was performed twice in total.

Figure 17:
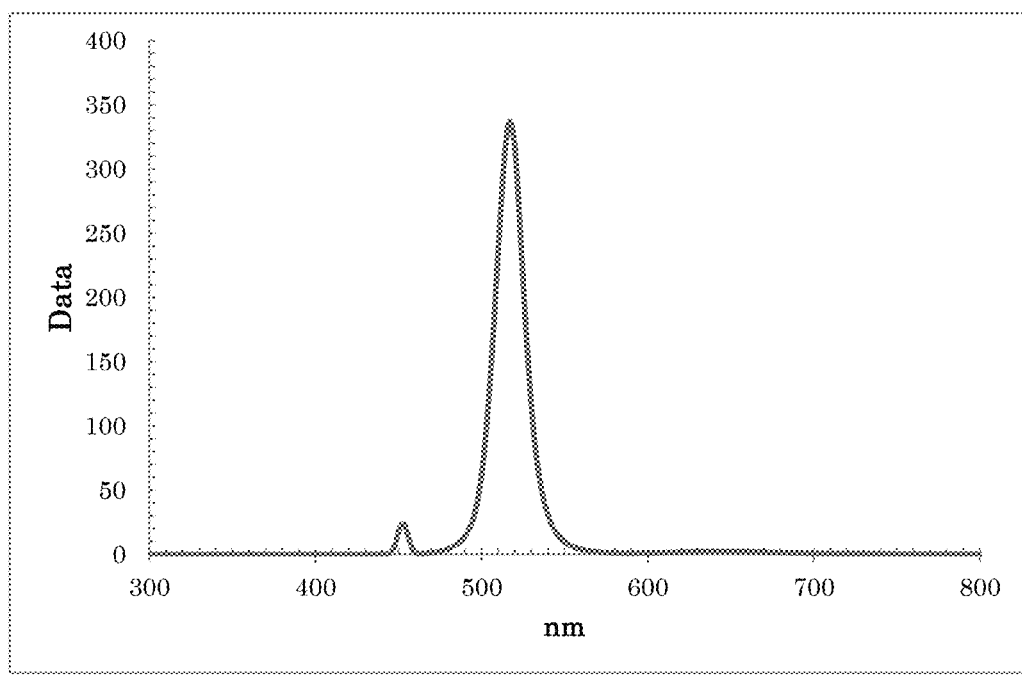
FIG. 17 shows a PL spectrum exhibited by ZnTe/ZnSe in Example 11.

As a result of a measurement on the resultant reaction solution using the spectrofluorometer, a fluorescence wavelength of 517.0 nm and a fluorescence FWHM of 20.1 nm were obtained as optical properties (FIG. 17).

Ethanol was added to the resultant reaction solution to cause precipitation, and centrifugal separation was performed to recover the precipitate. Toluene was added to disperse the precipitate, thereby obtaining a dispersion solution in which ZnTe/ZnSe particles were dispersed.

Example 12

Into a 100 mL reaction vessel, 0.091 g of anhydrous copper acetate: $Cu(OAc)_2$, 1.25 mL of dodecanethiol: DDT, 0.625 g of trioctylphosphine: TOP, and 10 mL of octadecene: ODE were charged, and the materials were dissolved by heating while stirring in an inert gas ($N_2$) atmosphere.

To this solution, 0.5 mL of a trioctylphosphine telluride: Te-TOP solution (0.5M) and 0.125 mL of oleylamine: OLAm were added, and heating was performed while stirring at 200° C. for 15 minutes. Further, 1.25 mL of a Se-ODE liquid solution (0.1M) was added and stirring was performed at 200° C. for 15 minutes, and 1.25 mL of a S-ODE liquid solution (0.1M) was then added and stirring was continuously performed at 200° C. for 15 minutes. After the resultant reaction solution was cooled to room temperature, 0.685 g of zinc chloride: $ZnCl_2$, 7.5 mL of trioctylphosphine: TOP, and 0.25 mL of oleylamine: OLAm were added to the reaction solution, and heating was performed while stirring in an inert gas ($N_2$) atmosphere at 220° C. for 30 minutes. Further, 1.25 mL of a zinc octanoate solution (0.1M) was added, and stirring was continuously performed at 220° C. for 10 minutes. Zinc octanoate was further added, and a process of heating and stirring was performed twice in total.

After the resultant reaction solution was cooled to room temperature, toluene and ethanol were added to cause precipitation, and centrifugal separation was performed to recover the precipitate. Octadecene: ODE was added in an amount of 11 mL to disperse the precipitate, thereby obtaining a dispersion solution in which ZnTe/ZnSe/ZnS particles were dispersed in ODE.

To the ODE dispersion solution, 0.685 g of zinc chloride: $ZnCl_2$, 7.5 mL of trioctylphosphine: TOP, and 0.25 mL of oleylamine: OLAm were added and heating was performed while stirring in an inert gas ($N_2$) atmosphere at 220° C. for 30 minutes. Further, 1.25 mL of a zinc octanoate solution (0.1M) was added, and stirring was continuously performed at 220° C. for 10 minutes. Zinc octanoate was further added, and a process of heating and stirring was performed twice in total.

Figure 18:
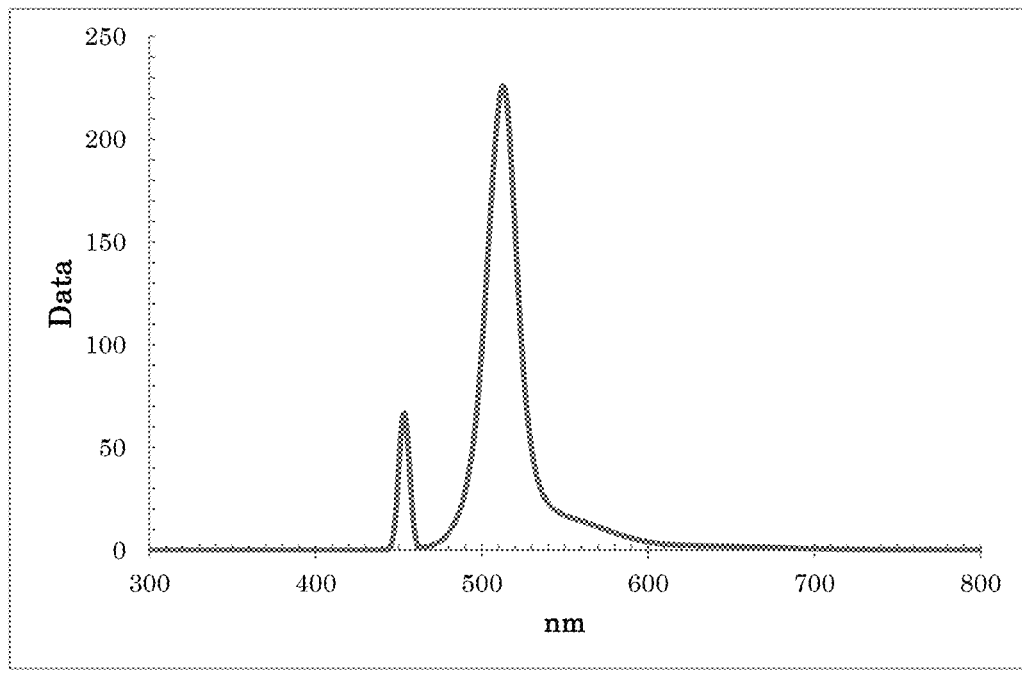
FIG. 18 shows a PL spectrum exhibited by ZnTe/ZnSe/ZnS in Example 12.

As a result of a measurement on the resultant reaction solution using the spectrofluorometer, a fluorescence wavelength of 513.0 nm and a fluorescence FWHM of 21.6 nm were obtained as optical properties (FIG. 18).

Ethanol was added to the resultant reaction solution to cause precipitation, and centrifugal separation was performed to recover the precipitate. Toluene was added to disperse the precipitate, thereby obtaining a dispersion solution in which ZnTe/ZnSe/ZnS particles were dispersed.

Example 13

Into a 100 mL reaction vessel, 0.182 g of anhydrous copper acetate: $Cu(OAc)_2$, 1 mL of a trioctylphosphine telluride Te-TOP solution (0.5M), 2.5 mL of dodecanethiol: DDT, and 20 mL of octadecene: ODE were charged. After that, heating was performed while stirring in an inert gas ($N_2$) atmosphere, thereby dissolving the materials.

This solution was heated while stirring at 180° C. for 10 minutes, followed by the addition of 0.25 mL of oleylamine: OLAm, and heating was then performed while stirring at 180° C. for 10 minutes. The resultant reaction solution was cooled to room temperature. To the reaction solution, 1.37 g of zinc chloride: $ZnCl_2$, 15 mL of trioctylphosphine: TOP, and 0.25 mL of oleylamine: OLAm were added, and heating was performed while stirring in an inert gas ($N_2$) atmosphere at 220° C. for 30 minutes. Further, 2.5 mL of a zinc octanoate solution (0.1M) was added, and stirring was continuously performed at 220° C. for 10 minutes. Zinc octanoate was further added, and a process of heating and stirring was performed twice in total. The resultant reaction solution (ZnTeS) was then cooled to room temperature.

Into 10 mL of the reaction solution, 0.241 g of hexadecylamine: HDA was charged, and heating was performed while stirring in an inert gas ($N_2$) atmosphere at 220° C. for 5 minutes. Further, 2 mL of trioctylphosphine: TOP, 0.125 mL of Se-TOP (1M), and 0.375 mL of S-TOP (1M) were mixed, and 0.25 mL of the mixed solution was added to the reaction solution, and stirring was continuously performed at 220° C. for 10 minutes. The remaining mixed solution was further added, and a process of heating and stirring was performed ten times in total. After that, 1 mL of a zinc octanoate solution (0.1M) was added, and stirring was continuously performed at 220° C. for 10 minutes. Zinc octanoate was further added, and a process of heating and stirring was performed twice in total.

Figure 19:
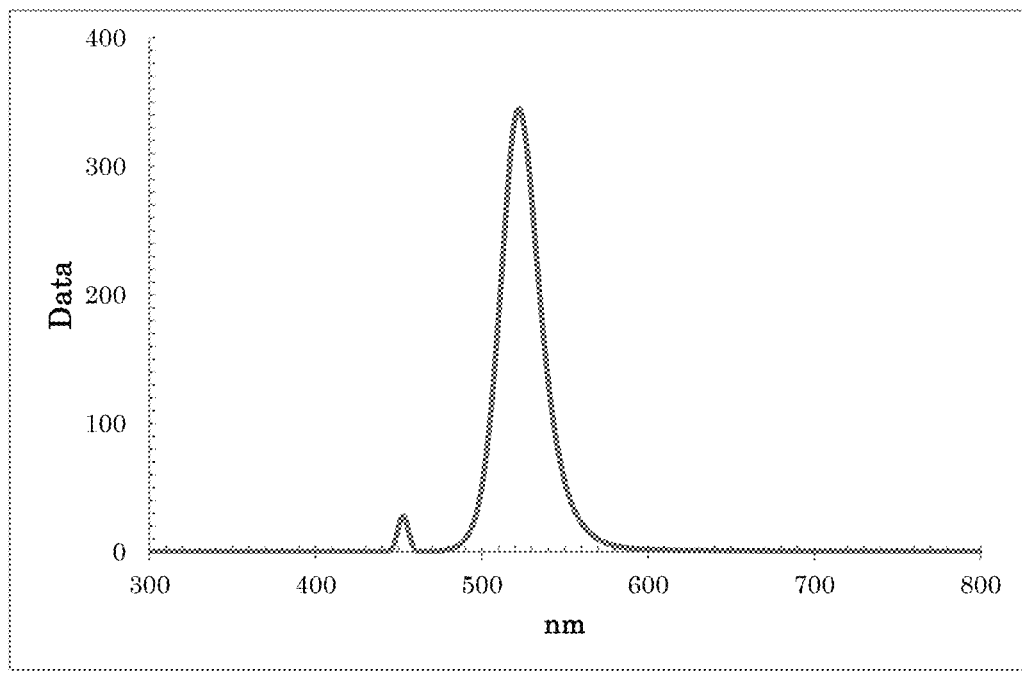
FIG. 19 shows a PL spectrum exhibited by ZnTeS/ZnSeS in Example 13.

As a result of measurements on the resultant reaction solution using the spectrofluorometer and the quantum efficiency measurement system, a fluorescence wavelength of 522.5 nm, a fluorescence FWHM of 27.3 nm, and a quantum yield of approximately 12% were obtained as optical properties (FIG. 19).

Ethanol was added to the resultant reaction solution to cause precipitation, and centrifugal separation was performed to recover the precipitate. Toluene was added to disperse the precipitate, thereby obtaining a dispersion solution in which ZnTeS/ZnSeS particles were dispersed.

Example 14

Into a 100 mL reaction vessel, 0.182 g of anhydrous copper acetate: $Cu(OAc)_2$, 1 mL of a trioctylphosphine telluride: Te-TOP solution (0.5M), 0.439 mL of a Se-DDT/OLAm (0.285M), 2.5 mL of dodecanethiol: DDT, 0.25 mL of oleylamine: OLAm, 0.387 g of trioctylphosphine oxide: TOPO, and 20 mL of octadecene: ODE were charged, and the materials were dissolved by heating while stirring in an inert gas ($N_2$) atmosphere.

This solution was heated while stirring at 180° C. for 20 minutes. The resultant reaction solution was cooled to room temperature. After that, 1.37 g of zinc chloride: $ZnCl_2$, 15 mL of trioctylphosphine: TOP, 0.5 mL of oleylamine: OLAm, and 0.131 mL of triphenyl phosphite were added to the reaction solution, and heating was performed while stirring in an inert gas ($N_2$) atmosphere at 220° C. for 30 minutes. Further, 2.5 mL of a zinc octanoate solution (0.1M) was added, and stirring was continuously performed at 220° C. for 10 minutes. Zinc octanoate was further added, and a process of heating and stirring was performed twice in total. The resultant reaction solution (ZnTeSeS) was then cooled to room temperature.

Into 10 mL of the reaction solution, 0.241 g of hexadecylamine: HDA was charged, and heating was performed while stirring in an inert gas ($N_2$) atmosphere at 240° C. for 5 minutes. Further, 1.125 mL of trioctylphosphine: TOP, 0.031 mL of Se-TOP (1M), and 0.094 mL of S-TOP (1M) were mixed, and 0.125 mL of the mixed solution was added to the reaction solution, and stirring was continuously performed at 240° C. for 5 minutes. The remaining mixed solution was further added, and a process of heating and stirring was performed ten times in total. After that, 0.5 mL of a zinc octanoate solution (0.1M) was added, and stirring was continuously performed at 240° C. for 5 minutes. Zinc octanoate was further added, and a process of heating and stirring was performed twice in total.

Figure 20:
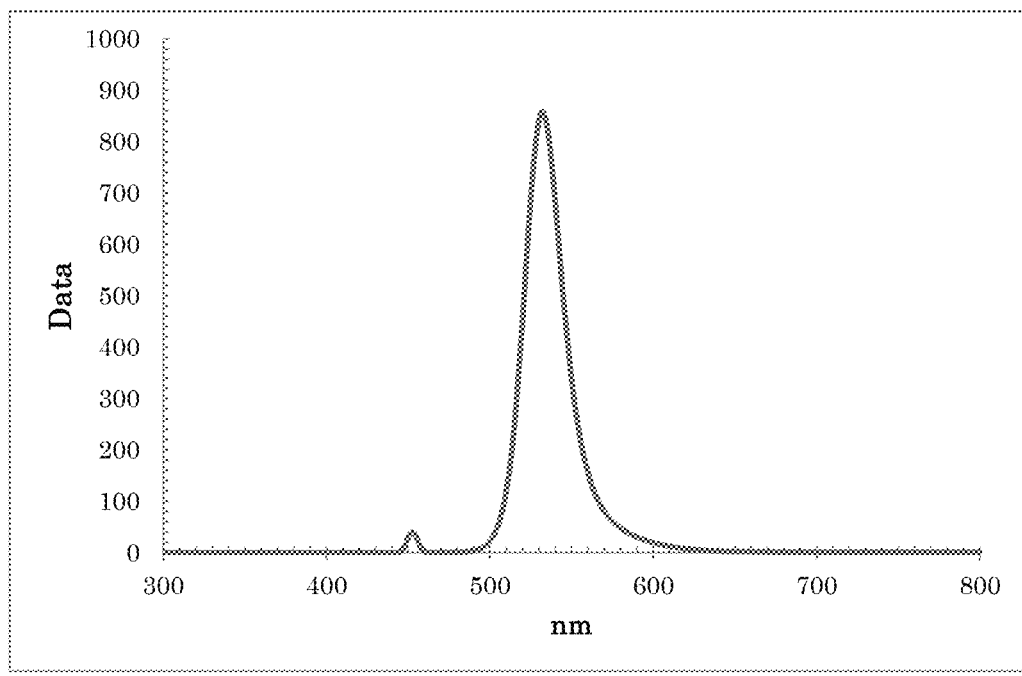
FIG. 20 shows a PL spectrum exhibited by ZnTeSeS/ZnSeS in Example 14.

As a result of measurements on the resultant reaction solution using the spectrofluorometer and the quantum efficiency measurement system, a fluorescence wavelength of 532.0 nm, a fluorescence FWHM of 27.6 nm, and a quantum yield of approximately 20% were obtained as optical properties (FIG. 20).

Ethanol was added to the resultant reaction solution to cause precipitation, and centrifugal separation was performed to recover the precipitate. Toluene was added to disperse the precipitate, thereby obtaining a dispersion solution in which ZnTeSeS/ZnSeS particles were dispersed.

Example 15

Into a 100 mL reaction vessel, 72.7 mg of anhydrous copper acetate: $Cu(OAc)_2$, 0.5 mL of dodecanethiol: DDT, 0.1 mL of oleylamine: OLAm, and 10 mL of octadecene: ODE were charged. After that, heating was performed while stirring in an inert gas ($N_2$) atmosphere, thereby dissolving the materials.

To this solution, 0.65 mL of a trioctylphosphine telluride: Te-TOP solution (0.5M) was added, and heating was performed while stirring at 220° C. for 5 minutes. After that, 0.1 mL of trioctylphosphine selenide: Se-TOP solution (1M) was added, and heating was performed while stirring at 220° C. for 5 minutes. The resultant reaction solution was cooled to room temperature.

To this reaction solution, 550 mg of zinc chloride: $ZnCl_2$, 6 mL of trioctylphosphine: TOP, and 0.2 mL of oleylamine: OLAm were added, and heating was performed while stirring in an inert gas ($N_2$) atmosphere at 220° C. for 15 minutes and at 280° C. for 110 minutes.

After that, 1 ml of a solution obtained by mixing 12 ml of Zn octanoate (0.4M) and 1.1 ml of DDT was dropped, and heating was performed while stirring at 280° C. for 60 minutes.

Figure 21:
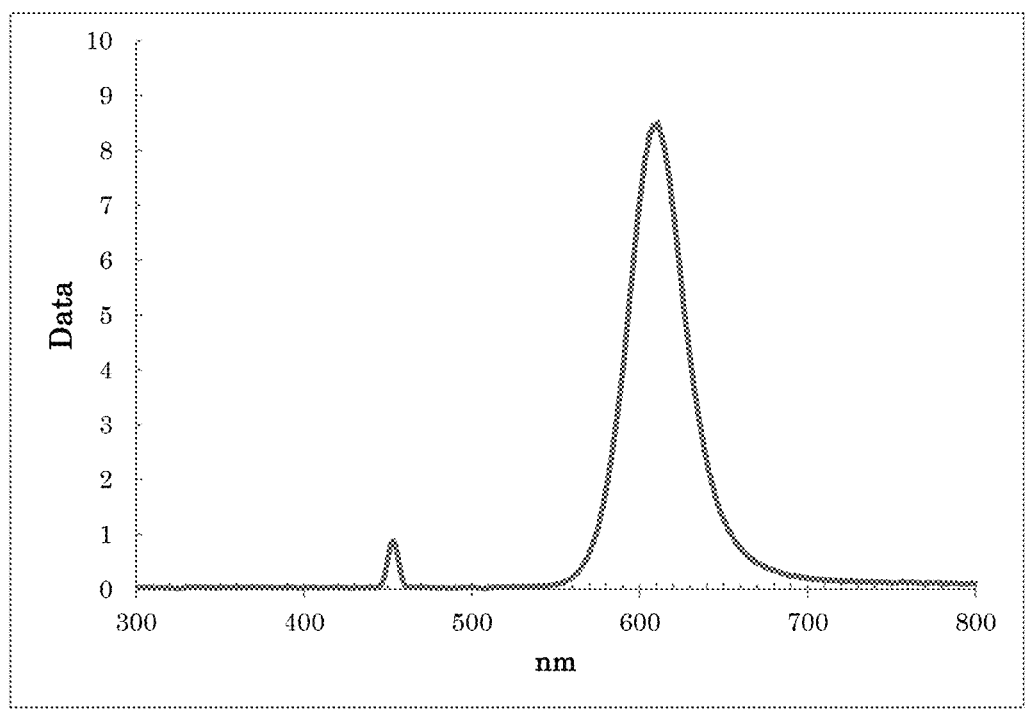
FIG. 21 shows a PL spectrum exhibited by ZnTe/ZnSe in Example 15.

As a result of a measurement on the resultant reaction solution using the spectrofluorometer, a fluorescence wavelength of approximately 610 nm and a fluorescence FWHM of approximately 38.5 nm were obtained as optical properties (FIG. 21).

Ethanol was added to the resultant reaction solution to cause precipitation, and centrifugal separation was performed to recover the precipitate. Toluene was added to disperse the precipitate, thereby obtaining a dispersion solution in which ZnTe/ZnSe particles were dispersed.

Example 16

Into a 100 mL reaction vessel, 131 mg of copper acetylacetonate: $Cu(acac)_2$, 1.5 mL of dodecanethiol: DDT, 4.75 mL of oleylamine: OLAm, and 6.25 mL of octadecene: ODE were charged. After that, heating was performed while stirring in an inert gas ($N_2$) atmosphere, thereby dissolving the materials.

To this solution, 1.75 mL of a Se-DDT/OLAm solution (0.3M) was added, and heating was performed while stirring at 220° C. for 10 minutes. The resultant reaction solution ($Cu_2Se(S)$) was cooled to room temperature.

Ethanol was added to the $Cu_2Se$ reaction solution to cause precipitation, and centrifugal separation was performed to recover the precipitate. ODE was added to disperse the precipitate.

After that, 682 mg of zinc chloride: $ZnCl_2$, 5 mL of trioctylphosphine: TOP, and 0.5 mL of oleylamine: OLAm were added to the ZnSe(S)-ODE solution, and heating was performed while stirring in an inert gas ($N_2$) atmosphere at 280° C. for 120 minutes. The resultant reaction solution (ZnSe(S)) was cooled to room temperature.

Figure 22:
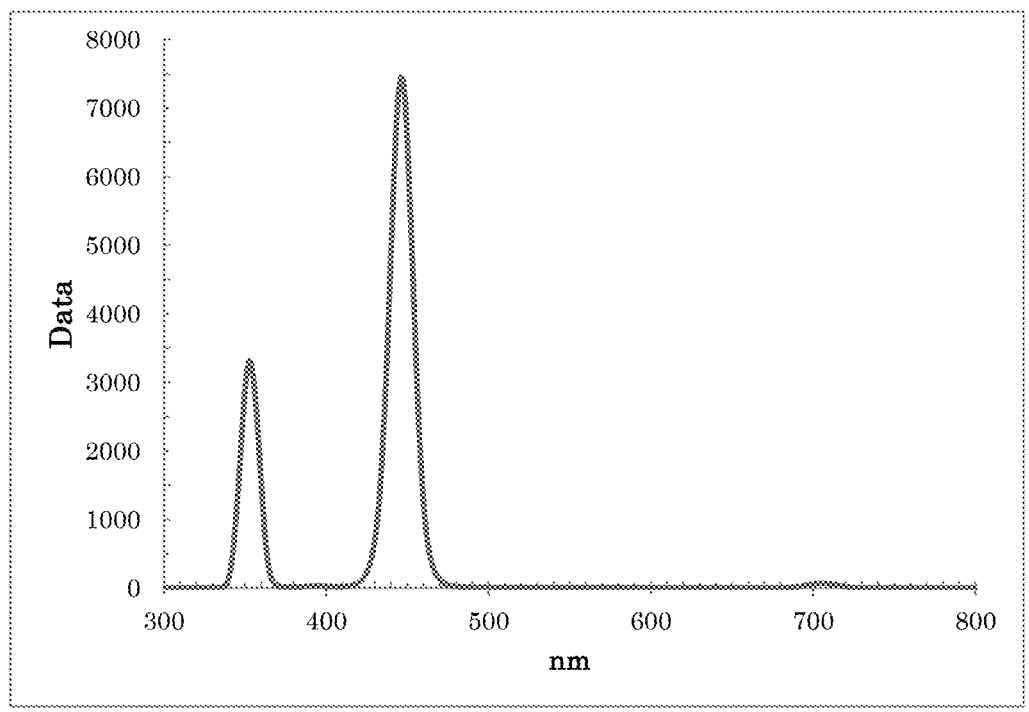
FIG. 22 shows a PL spectrum exhibited by ZnSe in Example 16.

As a result of measurements on the resultant reaction solution using the spectrofluorometer and the quantum efficiency measurement system, a fluorescence wavelength of approximately 446.0 nm, a fluorescence FWHM of approximately 16.6 nm, and a quantum yield of approximately 30.6% were obtained as optical properties (FIG. 22).

Ethanol was added to the resultant reaction solution to cause precipitation, and centrifugal separation was performed to recover the precipitate. Toluene was added to disperse the precipitate, thereby obtaining a dispersion solution in which ZnSe particles were dispersed.

Comparative Example 1

Into a 100 mL reaction vessel, 91.7 mg of anhydrous zinc acetate: $Zn(OAc)_2$, 10 mL of octadecene: ODE, 3 mL of oleylamine: OLAm, and 3 mL of trioctylphosphine: TOP were charged. After that, heating was performed while stirring in an inert gas ($N_2$) atmosphere, thereby dissolving the materials.

To this solution, 0.5 mL of a trioctylphosphine telluride: Te-TOP solution (0.5M) was added, and heating was performed while stirring at 280° C. for 10 minutes. The reaction solution was changed from a pale yellow solution to a reddish brown suspension, and the resultant solution was exposed to light of 365 nm emitted by a blacklight; however, no fluorescence was observed.

Comparative Example 2

Into a 100 mL reaction vessel, 68.1 mg of anhydrous zinc chloride: $ZnCl_2$, 10 mL of octadecene: ODE, 3 mL of oleylamine: OLAm, and 3 mL of trioctylphosphine: TOP were charged. After that, heating was performed while stirring in an inert gas ($N_2$) atmosphere, thereby dissolving the materials.

To this solution, 0.5 mL of a trioctylphosphine telluride: Te-TOP solution (0.5M) was added, and heating was performed while stirring at 280° C. for 10 minutes. The reaction solution was changed from a pale yellow solution to a reddish brown suspension, and the resultant solution was exposed to light of 365 nm emitted by a blacklight; however, no fluorescence was observed.

Comparative Example 3

Into a 100 mL reaction vessel, 316.2 mg of zinc stearate: $Zn(OC(=O)C_{17}H_{35})_2$, 10 mL of octadecene: ODE, 3 mL of oleylamine: OLAm, and 3 mL of trioctylphosphine: TOP were charged. After that, heating was performed while stirring in an inert gas ($N_2$) atmosphere, thereby dissolving the materials.

To this solution, 0.5 mL of a trioctylphosphine telluride: Te-TOP solution (0.5M) was added, and heating was performed while stirring at 280° C. for 10 minutes. The reaction solution was changed from a pale yellow solution to a reddish brown suspension, and the resultant solution was exposed to light of 365 nm emitted by a blacklight; however, no fluorescence was observed.

Comparative Example 4

Into a 100 mL reaction vessel, 314.2 mg of zinc oleate: $Zn(OC(=O)C_{17}H_{33})_2$, 10 mL of octadecene: ODE, 3 mL of oleylamine: OLAm, and 3 mL of trioctylphosphine: TOP were charged. After that, heating was performed while stirring in an inert gas ($N_2$) atmosphere, thereby dissolving the materials.

To this solution, 0.5 mL of a trioctylphosphine telluride: Te-TOP solution (0.5M) was added, and heating was performed while stirring at 280° C. for 10 minutes. The reaction solution was changed from a pale yellow solution to a reddish brown suspension, and the resultant solution was exposed to light of 365 nm emitted by a blacklight; however, no fluorescence was observed.

The materials for synthesis, conditions for precursor synthesis, metal exchange reaction conditions, shell coating conditions, fluorescence wavelength, and fluorescence FWHM in Example 1 to Example 16 are compiled in Table 1 shown below.

TABLE 1

| Example | Materials for synthesis | | Precursor synthesis conditions | Metal exchange reaction conditions | Shell coating conditions | Fluorescence wavelength (nm) | Fluorescence FWHM (nm) |
| --- | --- | --- | --- | --- | --- | --- | --- |
| 1 | $Cu(OAc)_2$ | 36.3 mg | 220° C. | 220° C. | | 518.5 | 243 |
| | Te-TOP | 0.2 mL | 10 min | 30 mm | | | |
| | DDT | 0.5 mL | | | | | |
| | OLAm | 0.1 mL | | | | | |

TABLE 1-continued

| Example | Materials for synthesis | | Precursor synthesis conditions | Metal exchange reaction conditions | Shell coating conditions | Fluorescence wavelength (nm) | Fluorescence FWHM (nm) |
|---|---|---|---|---|---|---|---|
| | ODE | 4 mL | | | | | |
| | ZnCl$_2$ | 273 mg | | | | | |
| | TOP | 3 mL | | | | | |
| 2 | Cu(OAc)$_2$ | 36.3 mg | 200° C. | 250° C. | | 510.0 | 223 |
| | Te-TOP | 0.2 mL | 10 min | 15 min | | | |
| | HDT | 63.8 μL | | | | | |
| | OLAm | 0.1 mL | | | | | |
| | ODE | 4 mL | | | | | |
| | ZnCl$_2$ | 273 mg | | | | | |
| | TOP | 3 mL | | | | | |
| 3 | Cu(OAc)$_2$ | 36.3 mg | 220° C. | 220° C. | | 529.5 | 26.1 |
| | Te-TOP | 0.2 mL | 20 min | 30 min | | | |
| | DDT | 4 mL | | | | | |
| | ZnCl$_2$ | 273 mg | | | | | |
| | TOP | 3 mL | | | | | |
| 4 | Cu(OAc)$_2$ | 72.7 mg | | | | | |
| | Te-TOP | 0.4 mL | | | | | |
| | Se-TOP | 0.2 mL | | | | | |
| | DDT | 1 mL | 220° C. | 220° C. | | 522.5 | 20 |
| | OLAm | 0.2 mL | 15 min | 30 min | | | |
| | ODE | 8 mL | | | | | |
| | ZnCl$_2$ | 546 mg | | | | | |
| | TOP | 6 mL | | | | | |
| 5 | Cu(OAc)$_2$ | 36.3 mg | 180° C. | 220° C. | | 542.0 | 27.8 |
| | Te-TOP | 0.2 mL | 15 min | 90 min | | | |
| | DDT | 0.5 mL | | | | | |
| | OLAm | 0.1 mL | | | | | |
| | ODE | 4 mL | | | | | |
| | ZnCl$_2$ | 819 mg | | | | | |
| | TOP | 3 mL | | | | | |
| 6 | Cu(OAc)$_2$ | 36.3 mg | 220° C. | 220° C. | | 520.5 | 22.4 |
| | Te-TOP | 0.2 mL | 20 min | 40 min | | | |
| | DDT | 4 mL | | | | | |
| | OLAm | 0.1 mL | | | | | |
| | ODE | 4 mL | | | | | |
| | ZnCl$_2$ | 273 mg | | | | | |
| | TOP | 3 mL | | | | | |
| | Zinc octanoate | 1 mL | | | | | |
| 7 | Cu(OAc)$_2$ | 0.091 g | 200° C. | 220° C. | | 502.0 | 17.9 |
| | Te-TOP | 0.5 mL | 7.0 mm | 50 min | | | |
| | DDT | 0.625 mL | | | | | |
| | OLAm | 0.375 mL | | | | | |
| | TOPO | 0.194 g | | | | | |
| | Tetradecane | 10 mL | | | | | |
| | TOP | 8.125 mL | | | | | |
| | ZnCl$_2$ | 0.685 g | | | | | |
| | Triphenyl phosphite | 0.066 mL | | | | | |
| | Zinc octanoate | 2.5 mL | | | | | |
| 8 | Cu(OLAc)$_2$ | 0.8 mL | 220° C. | 220° C. | | 522.5 | 23.1 |
| | Te-TOP | 0.4 mL | 15 min | 50 min | | | |
| | Se-ODE | 2 mL | | | | | |
| | DDT | 1 mL | | | | | |
| | OLAm | 0.4 mL | | | | | |
| | ODE | 8 mL | | | | | |
| | ZnCl$_2$ | 0.546 g | | | | | |
| | TOP | 6 mL | | | | | |
| | Zinc octanoate | 1 mL | | | | | |
| 9 | Cu(OAc)$_2$ | 0.182 g | 180° C. | 220° C. | | 496.5 | 21.3 |
| | Te-TOP | 1 mL | 20 min | 50 min | | | |
| | Se-DDT/OLAm | 0.439 mL | | | | | |
| | DDT | 2.5 mL | | | | | |
| | OLAm | 0.75 mL | | | | | |
| | TOPO | 0.387 g | | | | | |
| | ODE | 20 mL | | | | | |
| | ZnCl$_2$ | 1.37 g | | | | | |
| | TOP | 15 mL | | | | | |
| | Zinc octanoate | 5 mL | | | | | |
| 10 | Cu(OAc)$_2$ | 0.091 g | | | | | |
| | Te-TOP | 0.5 mL | | | | | |
| | Se-TOP | 0.25 mL | | | | | |
| | DDT | 0.625 mL | | | | | |
| | OLAm | 0.375 mL | | | | | |
| | TOPO | 0.194 g | 180° C. | 220° C. | | 495.0 | 18.7 |
| | ODE | 10 mL | 20 min | 50 min | | | |
| | TOP | 8.125 mL | | | | | |

TABLE 1-continued

| Example | Materials for synthesis | | Precursor synthesis conditions | Metal exchange reaction conditions | Shell coating conditions | Fluorescence wavelength (nm) | Fluorescence FWHM (nm) |
|---|---|---|---|---|---|---|---|
| 11 | $ZnCl_2$ | 0.685 g | | | | | |
| | Triphenyl phosphite | 0.066 mL | | | | | |
| | Zinc octanoate | 2.5 mL | | | | | |
| | $Cu(OAc)_2$ | 0.091 g | 200° C. | 220° C. | | 517.0 | 20.1 |
| | Te-TOP | 0.5 mL | 45 min | 100 min | | | |
| | Se-ODE | 2.5 mL | | | | | |
| | DDT | 1.25 mL | | | | | |
| | OLAm | 0.625 mL | | | | | |
| | ODE | 21 mL | | | | | |
| | TOP | 15.625 mL | | | | | |
| | $ZnCl_2$ | 1.37 g | | | | | |
| | Zinc octanoate | 5 mL | | | | | |
| 12 | $Cu(OAc)_2$ | 0.091 g | 200° C. | 220° C. | | 513.0 | 21.6 |
| | Te-TOP | 0.5 mL | 45 min | 100 min | | | |
| | Se-ODE | 1.25 mL | | | | | |
| | S-ODE | 1.25 mL | | | | | |
| | DDT | 1.25 mL | | | | | |
| | OLAm | 0.625 mL | | | | | |
| | ODE | 21 mL | | | | | |
| | TOP | 15.625 mL | | | | | |
| | $ZnCl_2$ | 1.37 g | | | | | |
| | Zinc octanoate | 5 mL | | | | | |
| 13 | $Cu(OAc)_2$ | 0.182 g | 180° C. | 220° C. | 220° C. | 522.5 | 27.3 |
| | Te-TOP | 1 mL | 20 min | 50 min | 120 min | | |
| | Se-TOP | 0.125 mL | | | | | |
| | S-TOP | 0.375 mL | | | | | |
| | DDT | 2.5 mL | | | | | |
| | OLAm | 0.25 mL | | | | | |
| | HDA | 0.241 g | | | | | |
| | ODE | 20 mL | | | | | |
| | $ZnCl_2$ | 1.37 g | | | | | |
| | TOP | 17 mL | | | | | |
| | Zinc octanoate | 7 mL | | | | | |
| 14 | $Cu(OAc)_2$ | 0.182 g | 180° C. | 220° C. | 240° C. | 532.0 | 27.6 |
| | Te-TOP | 1 mL | 20 min | 50 min | 65 min | | |
| | Se-DDT/OLAm | 0.439 mL | | | | | |
| | Se-TOP | 0.031 mL | | | | | |
| | S-TOP | 0.094 mL | | | | | |
| | DDT | 2.5 mL | | | | | |
| | OLAm | 0.75 mL | | | | | |
| | HDA | 0.241 g | | | | | |
| | TOPO | 0.387 g | | | | | |
| | ODE | 20 mL | | | | | |
| | $ZnCl_2$ | 1.37 g | | | | | |
| | TOP | 16.125 mL | | | | | |
| | Zinc octanoate | 6 mL | | | | | |
| 15 | $Cu(OAc)_2$ | 72.7 mg | 220° C. | 220° C. | | 610.5 | 38.5 |
| | Te-TOP | 0.65 mL | 15 min | 15 min + | | | |
| | Se-TOP | 0.1 mL | | 280° C. | | | |
| | DDT | 0.58 mL | | 110 min | | | |
| | OLAm | 0.3 mL | | | | | |
| | ODE | 10 mL | | | | | |
| | $ZnCl_2$ | 550 mg | | | | | |
| | TOP | 6 mL | | | | | |
| | Zinc octanoate | 0.9 mL | | | | | |
| 16 | $Cu(acac)_2$ | 131 mg | 220 C. | 280° C. | | 446.0 | 16.6 |
| | Se-DDT/OLAm | 1.5 mL | 10 min | 120 min | | | |
| | DDT | 1.5 mL | | | | | |
| | OLAm | 5.25 mL | | | | | |
| | ODE | 6.25 mL | | | | | |
| | $ZnCl_2$ | 682 mg | | | | | |
| | TOP | 5 mL | | | | | |

As shown in Table 1, in each Example, the fluorescence FWHM was 40 nm or less. Further, it was found that the fluorescence FWHM could be controlled to 30 nm or less, the fluorescence FWHM could be controlled to be as lower as 28 nm or less, and the fluorescence FWHM could be controlled to be even as lower as approximately 25 nm or less.

Further, as shown in Table 1, the fluorescence wavelength was found to be possibly adjusted within a range of 400 nm to 650 nm.

Further, as shown in Table 1, quantum dots emitting green light were found to be possibly synthesized in Example 1 to Example 14, and quantum dots emitting red light in Example 15.

Figure 10:
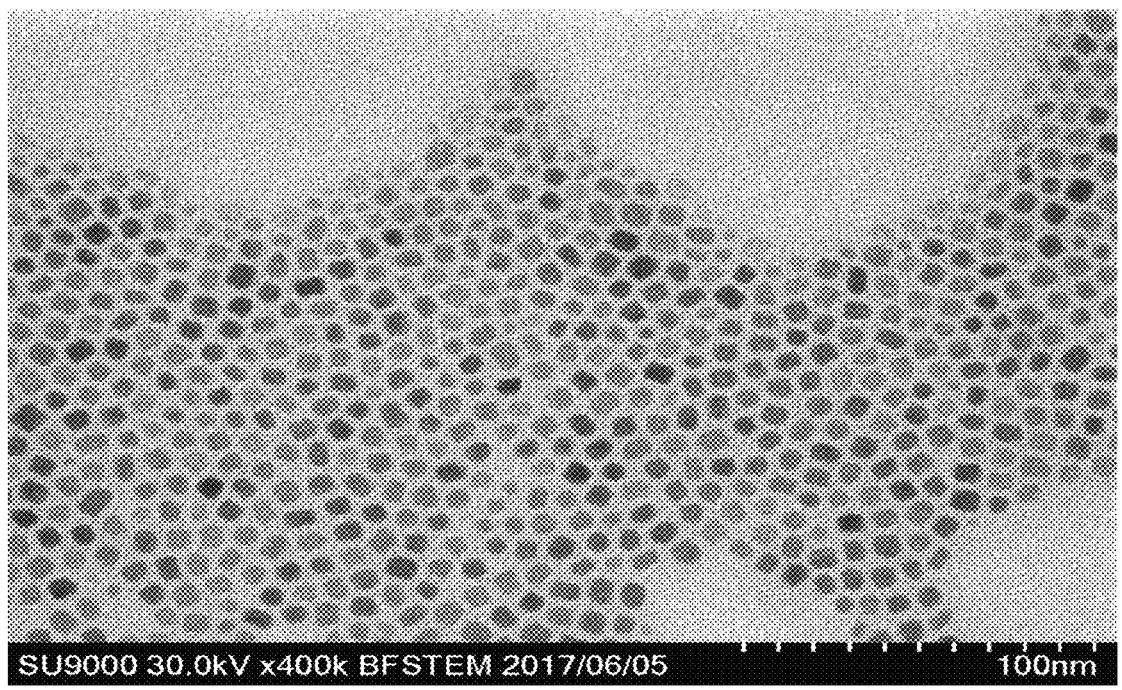
FIG. 10 is a photograph of ZnTe in Example 1, taken by scanning electron microscopy (SEM)

Moreover, the dispersion solution of ZnTe particles in Example 1 was subjected to measurements using the scanning electron microscope (SEM) and the X-ray diffraction (XRD) system. FIG. 10 shows the result of the measurement using the scanning electron microscope (SEM), and FIG. 11 shows the result of the measurement using the X-ray diffraction (XRD) system.

Further, the dispersion solution of $Cu_2Te$ particles in Example 1 was subjected to a measurement using the scanning electron microscope (SEM). The result is shown in FIG. 12.

Figure 12:
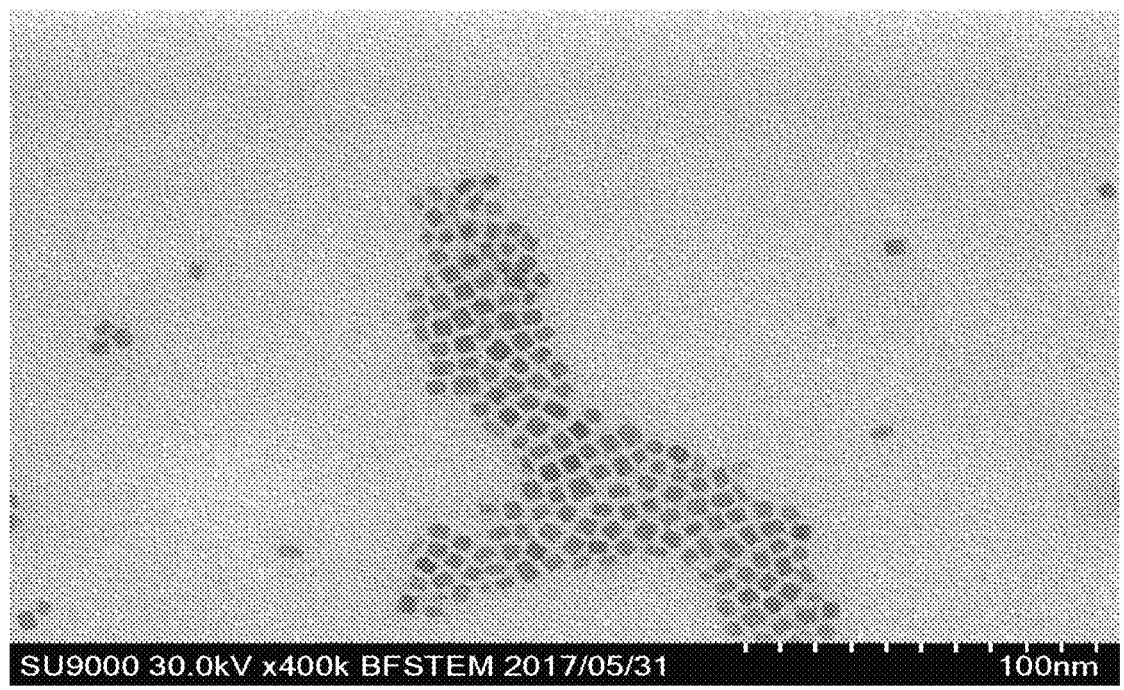
FIG. 12 is a SEM photograph of $Cu_2Te$ in Example 1.

As shown in FIG. 10 and FIG. 12, the ZnTe particles as quantum dots and $Cu_2Te$ as the precursor were found to have been formed to be substantially uniform in particle diameter.

Figure 11:
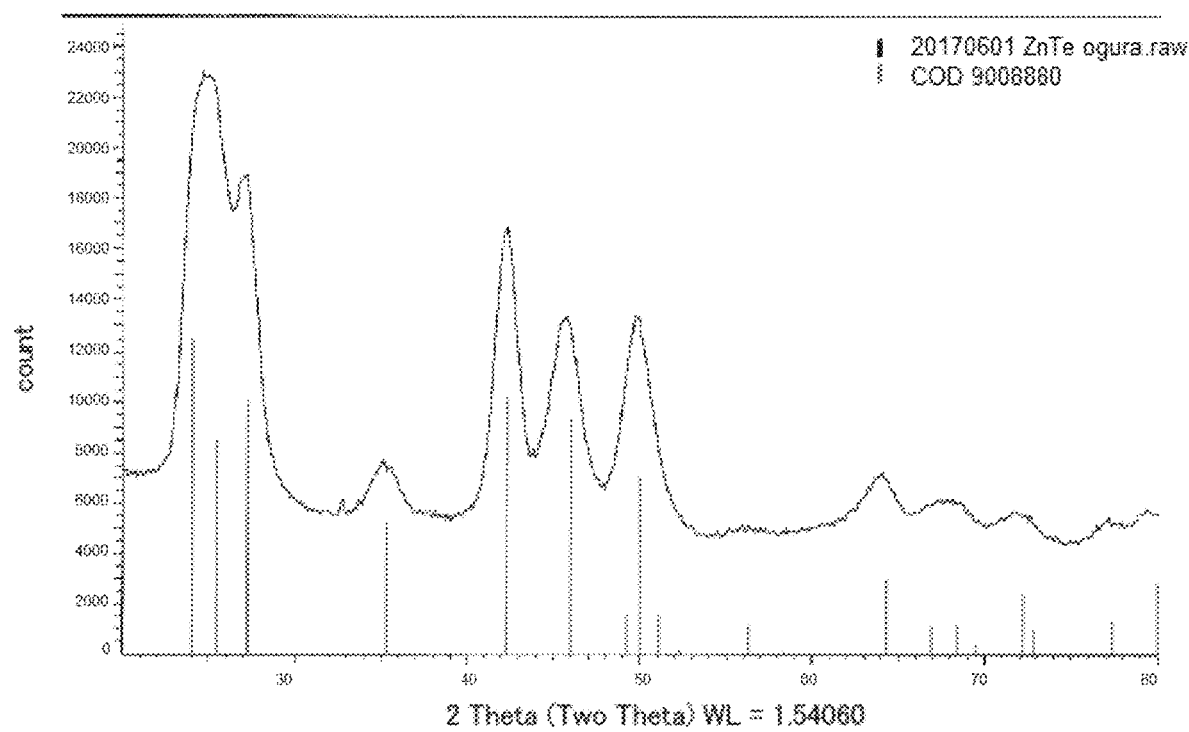
FIG. 11 shows an X-ray diffraction (XRD) spectrum exhibited by ZnTe in Example 1.

Further, the peak value of the XRD spectrum for ZnTe shown in FIG. 11 proved that a ZnTe solid solution was formed.

In the present invention, not only $Cu_2Te$ but also $Cu_2Se$ or $Cu_2S$ can be used as the precursor. In Example 16, ZnSe having a narrow blue light emission FWHM was successfully obtained using $Cu_2Se$ as the precursor.

In addition, ZnSe obtained using $Cu_2Se$ as the precursor was found to contain 100 ppm or less of Cu with respect to Zn by ICP analysis.

Also in this embodiment, ZnTe was obtained using $Cu_2Te$ as the precursor, Cu is considered to have been obtained. Thus, quantum dots of $Zn_{1-x}Cu_xTe$ (X<0.001)(X is the ratio of the number of Cu moles with respect to the total of the numbers of Zn and Cu moles) can be obtained by adjusting the Cu—Zn metal exchange reaction.

INDUSTRIAL APPLICABILITY

According to the present invention, for example, quantum dots exhibiting high intensity green fluorescence can be obtained. By applying quantum dots of the present invention to LEDs, back light units, display devices, etc., excellent emission properties can be obtained in those devices.

The present application is based on Japanese patent application No. 2017-145269 filed on Jul. 27, 2017 and Japanese patent application No. 2017-198667 filed on Oct. 12, 2017, the contents of which are hereby incorporated in their entirety.

The invention claimed is:

1. A method of producing a quantum dot, the method comprising:
    synthesizing copper chalcogenide, as a precursor, from an organic copper compound or an inorganic copper compound, and an organic chalcogen compound; and
    synthesizing a quantum dot using the precursor,
    wherein the quantum dot is free of cadmium and contains: zinc and tellurium; zinc, tellurium, and sulfur; or zinc, tellurium, selenium, and sulfur, and
    a fluorescence FWHM of the quantum dot is 40 nm or less.

2. The method according to claim 1, wherein metal exchange is performed between copper in the precursor made of the copper chalcogenide and zinc.

3. The method according to claim 2, wherein the metal exchange reaction is performed within a temperature range of temperature between 180° C. and 280° C.

4. The method according to claim 1, wherein the copper chalcogenide is synthesized within a range of a reaction temperature between 160° C. and 250° C.

5. The method according to claim 1, wherein the fluorescence FWHM is 30 nm or less.

6. The method according to claim 1, wherein the fluorescence FWHM is 25 nm or less.

7. The method according to claim 1, wherein the quantum dot is a nanocrystal.

8. The method according to claim 1, wherein the quantum dot has a core-shell structure in which a nanocrystal serves as a core and a surface of the core is coated with a shell.

9. The method according to claim 1, wherein a fluorescence wavelength of the quantum dot is 400 nm or more and 650 nm or less.

10. The method according to claim 1, wherein ligands are placed on a surface of the quantum dot.

11. The method according to claim 10, wherein the ligands are comprised of at least one selected from aliphatic amine-based compounds, phosphine-based compounds, and aliphatic carboxylic acid-based compounds.

* * * * *